US012672358B2

(12) United States Patent
Sun et al.

(10) Patent No.: US 12,672,358 B2
(45) Date of Patent: Jun. 30, 2026

(54) SOLAR CELL, MANUFACTURING METHOD, AND PHOTOVOLTAIC MODULE

(71) Applicant: LONGI GREEN ENERGY TECHNOLOGY CO., LTD., Xi'an (CN)

(72) Inventors: Zhaoqing Sun, Xi'an (CN); Shenghou Zhou, Xi'an (CN); Xiyan Tang, Xi'an (CN); Junjun Li, Xi'an (CN); Bingxuan He, Xi'an (CN); Feng Ye, Xi'an (CN); Chaowei Xue, Xi'an (CN); Liang Fang, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 19/165,836

(22) PCT Filed: Apr. 17, 2025

(86) PCT No.: PCT/CN2025/089653
§ 371 (c)(1),
(2) Date: Sep. 16, 2025

(87) PCT Pub. No.: WO2026/051372
PCT Pub. Date: Mar. 12, 2026

(65) Prior Publication Data
US 2026/0136680 A1 May 14, 2026

(30) Foreign Application Priority Data
Sep. 5, 2024 (CN) .......................... 202411239244.5

(51) Int. Cl.
H10F 10/14 (2025.01)
H10F 71/00 (2025.01)
(Continued)

(52) U.S. Cl.
CPC ......... H10F 10/146 (2025.01); H10F 71/103 (2025.01); H10F 71/134 (2025.01); H10F 77/1223 (2025.01); H10F 77/219 (2025.01)

(58) Field of Classification Search
None
See application file for complete search history.

(56) References Cited

U.S. PATENT DOCUMENTS

2011/0139216 A1 6/2011 Lee et al.
2011/0146759 A1 6/2011 Lee et al.
(Continued)

FOREIGN PATENT DOCUMENTS

CN 109301023 A 2/2019
CN 114005891 A 2/2022
(Continued)

OTHER PUBLICATIONS

Office Action in Chinese Appln. No. 202411239244.5, mailed on Oct. 28, 2024, 13 pages (with English translation).
(Continued)

*Primary Examiner* — Eli S Mekhlin
(74) *Attorney, Agent, or Firm* — Fish & Richardson P.C.

(57) ABSTRACT
A solar cell, a manufacturing method, and a photovoltaic module are provided. In one aspect, an solar cell includes a silicon substrate, a first transport layer, and a carrier collection layer. The silicon substrate has a first surface and a second surface opposite to each other. The first transport layer is arranged on at least one of the first surface and the second surface. The first transport layer includes a polysilicon layer having an amorphous silicon region. The amorphous silicon region is arranged on at least a part of a surface of the polysilicon layer away from the silicon substrate. The carrier collection layer is arranged on the first transport
(Continued)

layer, and at least a part of the carrier collection layer is in contact with the amorphous silicon region.

20 Claims, 9 Drawing Sheets

(51) Int. Cl.
    H10F 71/10 (2025.01)
    H10F 77/1223 (2025.01)
    H10F 77/20 (2025.01)

(56) References Cited

U.S. PATENT DOCUMENTS

| 2018/0114871 A1 | 4/2018 | Lin et al. |
| 2025/0008830 A1 | 1/2025 | He et al. |

FOREIGN PATENT DOCUMENTS

| CN | 115425114 A | 12/2022 | |
| CN | 116133448 A | 5/2023 | |
| CN | 116914012 A | 10/2023 | |
| CN | 117374169 B | 3/2024 | |
| CN | 117637891 A | 3/2024 | |
| CN | 117936616 A | 4/2024 | |
| CN | 118102737 A | 5/2024 | |
| CN | 118315453 A | 7/2024 | |
| CN | 118472072 A | 8/2024 | |
| CN | 118507560 A | 8/2024 | |
| CN | 118538792 A | 8/2024 | |
| CN | 118763139 A | 10/2024 | |
| EP | 4404278 A2 | 7/2024 | |
| NL | 2015534 A * | 4/2017 | ........... H10F 77/227 |

OTHER PUBLICATIONS

Search Report in Chinese Appln. No. 202411239244.5, mailed on Mar. 7, 2025, 5 pages (with English translation).

Office Action in Australian Appln. No. 2025234301, mailed on Nov. 10, 2025, 8 pages.

\* cited by examiner

1

SOLAR CELL, MANUFACTURING METHOD, AND PHOTOVOLTAIC MODULE

CROSS-REFERENCE TO RELATED APPLICATIONS

This application is a 371 national stage application of PCT Application No. PCT/CN2025/089653, filed on Apr. 17, 2025, which claims priority to Chinese Patent Application No. 202411239244.5, filed on Sep. 5, 2024. The disclosures of the aforementioned applications are hereby incorporated by reference in their entireties.

TECHNICAL FIELD

The present application relates to the field of solar photovoltaic technologies, and in particular, to a solar cell, a manufacturing method, and a photovoltaic module.

BACKGROUND

A solar cell is a device that directly converts luminous energy into electric energy. In the solar cell, a photo-generated carrier transport layer and a photo-generated carrier collection layer need to be manufactured at a silicon substrate of the solar cell to derive carriers, so as to generate electric energy. Currently, a contact resistance is increased after polysilicon at the photo-generated carrier transport layer is in contact with polysilicon at the photo-generated carrier collection layer. Therefore, the solar cell in the related art still has a defect of a large contact resistance, affecting an efficiency of the solar cell.

SUMMARY

In view of this, the present application provides a solar cell, a manufacturing method, and a photovoltaic module, and intends to partially or completely resolve a technical problem that a contact resistance of an existing solar cell is large, and affects an efficiency of the solar cell.

To achieve the foregoing objective, the technical solutions of the present application are implemented as follows.

According to a first aspect, an embodiment of the present application provides a solar cell. The solar cell includes a silicon substrate, a first transport layer, and a carrier collection layer. The silicon substrate has a first surface and a second surface, and the first surface is arranged opposite to the second surface. The first transport layer is arranged on at least one of the first surface and the second surface, and the first transport layer includes a polysilicon layer. The polysilicon layer of the first transport layer has an amorphous silicon region of the first transport layer, and the amorphous silicon region of the first transport layer is arranged on at least a part of a surface that is of the polysilicon layer of the first transport layer and that is away from the silicon substrate. The carrier collection layer is arranged on the first transport layer, and at least a part of the carrier collection layer is in contact with the amorphous silicon region of the first transport layer.

In an embodiment, the solar cell further includes a second transport layer. The first transport layer and the second transport layer are separately arranged on the first surface of the silicon substrate, and the first transport layer and the second transport layer are arranged spaced away.

In an embodiment, the solar cell further includes a second transport layer. The first transport layer is arranged on the first surface of the silicon substrate, and the second transport layer is arranged on the second surface of the silicon substrate.

In an embodiment, a thickness of the amorphous silicon region ranges from 3% to 30% of a thickness of the polysilicon layer in a thickness direction of the solar cell.

In an embodiment, a thickness of the amorphous silicon region ranges from 2 nm to 30 nm in a thickness direction of the solar cell.

In an embodiment, an area of the amorphous silicon region ranges from 10% to 90% of an area of the polysilicon layer in a direction perpendicular to a thickness direction of the solar cell and in a unit region in which the carrier collection layer is in direct contact with the first transport layer.

In an embodiment, an etching region is arranged on the surface that is of the polysilicon layer of the first transport layer and that is away from the silicon substrate, and the amorphous silicon region is arranged on the etching region.

In an embodiment, the amorphous silicon region includes a first doping element and/or a second doping element. The polysilicon layer includes the first doping element. A doping concentration of the amorphous silicon region is greater than a doping concentration of the polysilicon layer.

In an embodiment, the doping concentration of the amorphous silicon region ranges from $3 \times 10^{19}$ atom quantity/cm3 to $7 \times 10^{19}$ atom quantity/cm3.

In an embodiment, particles are arranged on the amorphous silicon region.

In an embodiment, the carrier collection layer further includes a transparent conductive layer. The transparent conductive layer is at least connected to a part of the surface that is of the polysilicon layer and that is away from the silicon substrate, at least connected to a part of a surface that is of the amorphous silicon region and that is away from the silicon substrate, and at least connected to a part of a surface that is of the second transport layer and that is away from the silicon substrate.

In an embodiment, an end portion that is of the first transport layer and that is close to the second transport layer and an end portion that is of the second transport layer and that is close to the first transport layer are laminated to form a laminated portion. The end portion of the first transport layer is arranged between the end portion of the second transport layer and the first surface. The carrier collection layer further includes a transparent conductive layer. The transparent conductive layer is at least connected to a part of a surface that is of the first transport layer and that is away from the silicon substrate, and at least connected to a part of a surface that is of the second transport layer and that is away from the silicon substrate. The transparent conductive layer has a second opening, and the second opening is configured to break electrical connection between the first transport layer and the second transport layer.

In an embodiment, there is an isolation region between the first transport layer and the second transport layer. The carrier collection layer further includes a transparent conductive layer. The transparent conductive layer is at least connected to a part of a surface that is of the first transport layer and that is away from the silicon substrate, and at least connected to a part of a surface that is of the second transport layer and that is away from the silicon substrate. The transparent conductive layer has a third opening, and the third opening is configured to break electrical connection between the first transport layer and the second transport layer.

In an embodiment, the second transport layer includes a polysilicon layer. The polysilicon layer of the second transport layer has an amorphous silicon region of the second transport layer. The amorphous silicon region of the second transport layer is arranged on at least a part of a surface that is of the polysilicon layer of the second transport layer and that is away from the silicon substrate. The carrier collection layer is arranged on the second transport layer, and at least a part of the carrier collection layer is in contact with the amorphous silicon region of the second transport layer.

In an embodiment, an end portion that is of the first transport layer and that is close to the second transport layer and an end portion that is of the second transport layer and that is close to the first transport layer are laminated to form a laminated portion. The end portion of the first transport layer is arranged between the end portion of the second transport layer and the first surface. The second transport layer includes a laminated layer of an intrinsic amorphous silicon region and a doped amorphous silicon region. The doped amorphous silicon region covering the end portion of the first transport layer has a hole structure.

In an embodiment, a width of the doped amorphous silicon region having the hole structure ranges from 0.1 μm to 20 μm in an extension direction of the first surface of the silicon substrate.

In an embodiment, a shape of the hole structure is at least one of a circle, an ellipse, or an irregular pattern from a top view of the solar cell.

In an embodiment, the carrier collection layer is arranged on the first transport layer, and the carrier collection layer is in contact with the entire amorphous silicon region of the first transport layer.

In an embodiment, when the carrier collection layer is a laminated combination of a transparent conductive layer and a metal electrode layer, the transparent conductive layer is closer to the silicon substrate than the metal electrode layer. A projection of the transparent conductive layer on a surface of the silicon substrate covers the entire amorphous silicon region of the first transport layer, and a projection of the metal electrode layer on the surface of the silicon substrate at least covers a part of the amorphous silicon region of the first transport layer in a thickness direction of the solar cell. Alternatively, when the carrier collection layer is a metal electrode layer, a projection of the metal electrode layer on a surface of the silicon substrate covers the entire amorphous silicon region of the first transport layer in a thickness direction of the solar cell.

According to a second aspect, an embodiment of the present application provides a manufacturing method for a solar cell. The method includes the following steps: providing a silicon substrate, where the silicon substrate has a first surface and a second surface, and the first surface is arranged opposite to the second surface: forming a first transport layer on at least one of the first surface and the second surface, where the first transport layer includes a polysilicon layer: forming an amorphous silicon region of the first transport layer on at least a part of a surface that is of the polysilicon layer of the first transport layer and that is away from the silicon substrate; and forming a carrier collection layer at the first transport layer, where at least a part of the carrier collection layer is in contact with the amorphous silicon region of the first transport layer.

According to a third aspect, an embodiment of the present application provides a photovoltaic module. The photovoltaic module includes a cover plate, a back sheet, and a solar cell arranged between the cover plate and the back sheet. The solar cell includes the foregoing solar cell.

In the solar cell of the present application, at least a part of the carrier collection layer is arranged on the amorphous silicon region, and is in contact with the amorphous silicon region. A work function difference between the amorphous silicon region and the carrier collection layer is less than a work function difference between the polysilicon layer and the carrier collection layer, in other words, a contact barrier between the amorphous silicon region and the carrier collection layer is less than a contact barrier between the polysilicon layer and the carrier collection layer, so that a contact resistance between the amorphous silicon region and the carrier collection layer is less than a contact resistance between the polysilicon layer and the carrier collection layer. The amorphous silicon region can implement more proper energy-band matching and reduce a contact resistance, so that the solar cell can effectively convert the sunlight into electric energy, and a photoelectric conversion efficiency of the solar cell is improved.

The foregoing descriptions are merely an overview of the technical solutions in the present application. In order that technical solutions of the present application can be understood more clearly so that the technical solutions can be implemented according to content of this specification, and in order that the foregoing and other objectives, features, and advantages of the present application can be understood more clearly, specific implementations of the present application are described below.

BRIEF DESCRIPTION OF THE DRAWINGS

To describe the technical solutions in embodiments of the present application or the related art more clearly, the accompanying drawings required for describing the embodiments are briefly described below.

DESCRIPTIONS OF REFERENCE NUMERALS

Figure 1:
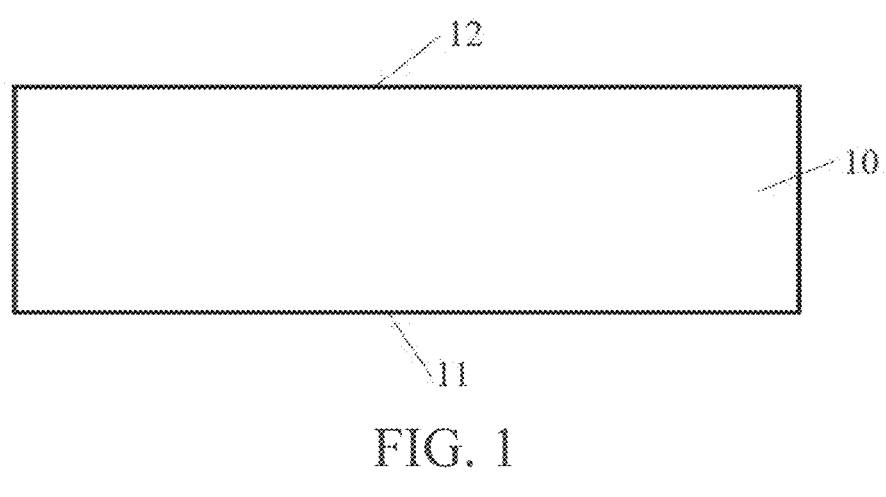
FIG. 1 to FIG. 12 are schematic diagrams of a structure of a solar cell in each preparation step according to an embodiment of the present application.

10—silicon substrate; 11—first surface; 12—second surface; 13—first region; 14—second region;

20—first transport layer; 21—first passivation layer; 22—polysilicon layer; 24—particles; 25—mask; 26—amorphous silicon region; 27—etching region;

30—second transport layer; 31—second passivation layer; 32—second doped layer; 33—region in which a hole structure is arranged;
40—transparent conductive layer;
50—laminated portion;
61—first electrode; 62—second electrode; 70—third passivation layer; 80—anti-reflection layer;
91—first opening; 92—second opening.

DETAILED DESCRIPTION

The following describes exemplary embodiments of the present application in further detail with reference to the accompanying drawings. Although the exemplary embodiments of the present application are shown in the accompanying drawings, it should be understood that the present application may alternatively be implemented in various manners and should not be limited by the embodiments described herein. On the contrary, the embodiments are provided, so that the present application can be understood more thoroughly and a scope of the present application can be completely conveyed to a person skilled in the art.

FIG. 1 to FIG. 12 are schematic diagrams of a solar cell in each preparation step according to an embodiment of the present application. An embodiment of the present application discloses a solar cell. The solar cell includes a silicon substrate 10, a first transport layer 20, and a carrier collection layer. The silicon substrate 10 has a first surface 11 and a second surface 12, and the first surface 11 is arranged opposite to the second surface 12. The first transport layer 20 is arranged on at least one of the first surface 11 and the second surface 12, and the first transport layer 20 includes a polysilicon layer 22. The polysilicon layer 22 of the first transport layer 20 has an amorphous silicon region 26 of the first transport layer 20, and the amorphous silicon region 26 of the first transport layer 20 is arranged on at least a part of a surface that is of the polysilicon layer 22 of the first transport layer 20 and that is away from the silicon substrate 10. The carrier collection layer is arranged on the first transport layer 20, and at least a part of the carrier collection layer is in contact with the amorphous silicon region 26 of the first transport layer 20.

Specifically, in the solar cell, one of the first surface 11 and the second surface 12 is a front surface of the silicon substrate 10, and the other of the first surface 11 and the second surface 12 is a back surface of the silicon substrate 10.

That the first transport layer 20 is arranged on at least one of the first surface 11 and the second surface 12 refers to the following three cases: In a first case, the first transport layer 20 is arranged on the first surface 11. In a second case, the first transport layer 20 is arranged on the second surface 12. In a third case, the first transport layer 20 is arranged on both the first surface 11 and the second surface 12.

In this embodiment of the present application, at least a part of the carrier collection layer is arranged on the amorphous silicon region 26, and is in contact with the amorphous silicon region 26. A work function difference between the amorphous silicon region 26 and the carrier collection layer is less than a work function difference between the polysilicon layer 22 and the carrier collection layer, in other words, a contact barrier between the amorphous silicon region 26 and the carrier collection layer is less than a contact barrier between the polysilicon layer 22 and the carrier collection layer, so that a contact resistance between the amorphous silicon region 26 and the carrier collection layer is less than a contact resistance between the polysilicon layer 22 and the carrier collection layer. The amorphous silicon region 26 can implement more proper energy-band matching and reduce a contact resistance, so that the solar cell can effectively convert the sunlight into electric energy, and a photoelectric conversion efficiency of the solar cell is improved.

In an embodiment, the amorphous silicon region 26 is formed by converting, after laser is applied to the polysilicon layer 22, at least a part of a surface that is of the polysilicon layer 22 and that is away from the silicon substrate 10 into amorphous silicon, so that the photoelectric conversion efficiency of the solar cell is improved by using the amorphous silicon region 26.

In an embodiment, the carrier collection layer may be specifically set based on a use requirement. For example, the carrier collection layer includes at least one or a laminated combination of a transparent conductive layer 40 and a metal electrode layer.

In an embodiment, the metal electrode layer may be specifically set based on a use requirement. For example, the metal electrode layer includes at least one or a laminated combination of a conductive slurry layer, a metal layer, and a metal alloy layer.

In an embodiment, the metal layer may alternatively be specifically set based on a use requirement. For example, the metal layer includes a single-layer structure formed by using single metal, a multi-layer structure of a same metal material, or a multi-layer structure of different metal materials.

In an embodiment, the solar cell further includes a second transport layer 30. The first transport layer 20 and the second transport layer 30 are separately arranged on the first surface 11 of the silicon substrate 10, and the first transport layer 20 and the second transport layer 30 are arranged spaced away.

In the foregoing structure of this embodiment of the present application, the solar cell is a back contact solar cell (BC solar cell). To be specific, an electrode is arranged on a back surface, and there is no electrode on a front surface. A material of the second transport layer 30 in the solar cell is specifically set based on a use requirement. For example, the second transport layer 30 includes an intrinsic amorphous silicon region and a doped amorphous silicon region, or the second transport layer 30 includes a polysilicon layer and a passivation layer.

The first transport layer 20 and the second transport layer 30 are separately arranged on the first surface 11 of the silicon substrate 10, and the first transport layer 20 and the second transport layer 30 are arranged spaced away. Being arranged spaced away refers to that the first transport layer 20 and the second transport layer 30 are alternately arranged spaced away on a plane of the silicon substrate 10 in an extension direction of the plane of the silicon substrate 10, that is, a first direction A, and the first transport layer 20 is in contact or not in contact with the second transport layer 30 in the extension direction of the plane of the silicon substrate 10. Alternatively, the first transport layer 20 and the second transport layer 30 are alternately arranged spaced away on the plane of the silicon substrate 10 in the extension direction of the plane of the silicon substrate 10, that is, the first direction A, and the first transport layer 20 partially overlaps the second transport layer 30 in a thickness direction of the silicon substrate 10 (a second direction B). A type of the first transport layer 20 is different from a type of the second transport layer 30. One of the first transport layer 20 and the second transport layer 30 is an electronic transport layer, and the other of the first transport layer 20 and the second transport layer 30 is a hole transport layer.

In an embodiment, the solar cell further includes a second transport layer 30. The first transport layer 20 is arranged on the first surface 11 of the silicon substrate 10, and the second transport layer 30 is arranged on the second surface 12 of the silicon substrate 10.

In the foregoing structure of this embodiment of the present application, the solar cell is a double-side solar cell. To be specific, electrodes are arranged on both a front surface and a back surface. A material of the second transport layer 30 in the solar cell is also specifically set based on a use requirement. This is not limited in this embodiment of the present application.

Figures 11, 12:
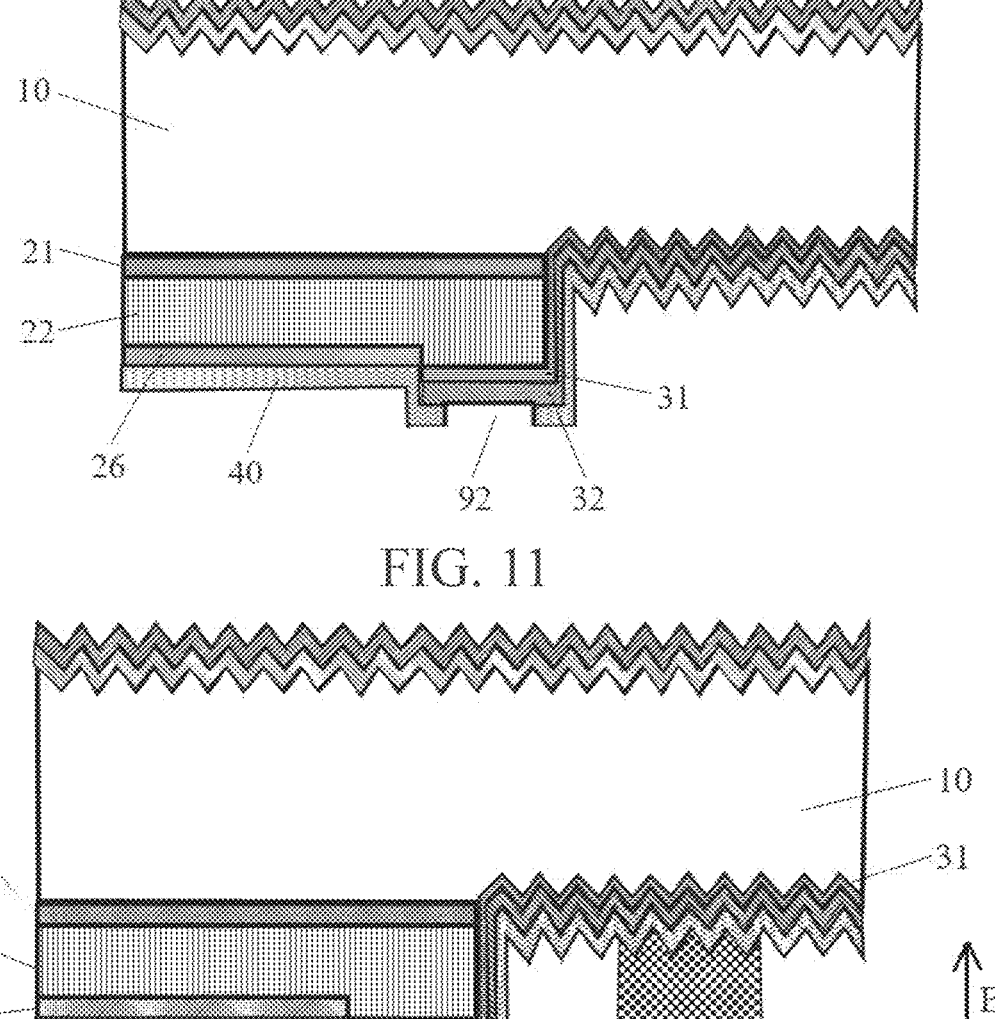

In an embodiment, a thickness of the amorphous silicon region 26 ranges from 3% to 30% of a thickness of the polysilicon layer 22 in a thickness direction of the solar cell. Referring to FIG. 12, the thickness direction of the solar cell is the second direction B. When the thickness of the amorphous silicon region 26 ranges from 3% to 30% of the thickness of the polysilicon layer 22, the amorphous silicon region 26 can implement more proper energy-band matching and reduce a contact resistance.

During actual application, a percentage of the thickness of the amorphous silicon region 26 in the thickness of the polysilicon layer 22 is specifically set based on a use requirement. For example, the thickness of the amorphous silicon region 26 is any one of 3%, 5%, 7%, 9%, 10%, 11%, 13%, 18%, 20%, 22%, 24%, 26%, 28%, or 30% of the thickness of the polysilicon layer 22.

In an embodiment, a thickness of the amorphous silicon region 26 ranges from 2 nm to 30 nm in a thickness direction of the solar cell. In an embodiment, the thickness of the amorphous silicon region 26 ranges from 4 nm to 15 μm. In an embodiment, the thickness of the amorphous silicon region 26 ranges from 5 nm to 10 μm. It may be understood that the thickness of the amorphous silicon region 26 in the thickness direction of the solar cell is set based on a use requirement, and the thickness of the amorphous silicon region 26 is related to a laser energy. For example, the thickness of the amorphous silicon region 26 is 2 nm, 3 nm, 4 nm, 5 nm, 7 nm, 9 nm, 10 nm, 13 nm, 15 nm, 18 nm, 20 nm, 22 nm, 24 nm, 26 nm, 28 nm, or 30 nm.

In an embodiment, an area of the amorphous silicon region 26 ranges from 10% to 90% of an area of the polysilicon layer 22 in a direction perpendicular to a thickness direction of the solar cell and in a unit region including only the first transport layer 20 but no another transport layer. In an embodiment, the area of the amorphous silicon region 26 ranges from 50% to 90% of the area of the polysilicon layer 22. In an embodiment, the area of the amorphous silicon region 26 ranges from 70% to 90% of the area of the polysilicon layer 22. In this embodiment of the present application, when the area of the amorphous silicon region 26 is in the foregoing range of the area of the polysilicon layer 22, the amorphous silicon region 26 can effectively reduce the contact resistance, so that the solar cell can effectively convert the sunlight into electric energy, and the photoelectric conversion efficiency of the solar cell is improved. The unit region is a test region, and testing may be performed by using a test instrument such as a TEM. For example, the unit region may be a region with a length of 1 μm and a width of 1 μm, a region with a length of 500 nm and a width of 500 nm, or a region with a length of 100 nm and a width of 100 nm. A size of the unit region (the test region) herein is not specifically limited, and may be specifically implemented based on an actual requirement.

During actual application, a percentage of the area of the amorphous silicon region 26 in the area of the polysilicon layer 22 is specifically set based on a use requirement. For example, the area of the amorphous silicon region 26 is any one of 10%, 15%, 20%, 25%, 30%, 35%, 40%, 45%, 50%, 55%, 60%, 65%, 70%, 75%, 80%, 85%, or 90% of the area of the polysilicon layer 22.

In an embodiment, at the first transport layer 20, in a region that is at the carrier collection layer and that is configured to collect carriers generated at the first transport layer 20, an etching region 27 is arranged on the surface that is of the polysilicon layer 22 of the first transport layer 20 and that is away from the silicon substrate 10, and the amorphous silicon region 26 is arranged on the etching region 27. The etching region 27 is a region formed when laser ablates the polysilicon layer 22, and the amorphous silicon region 26 is arranged on the etching region 27. To be specific, the etching region 27 is arranged on the surface that is of the polysilicon layer 22 of the first transport layer 20 and that is away from the silicon substrate 10, and the amorphous silicon region 26 is arranged on the etching region 27. The etching region 27 is arranged on a region in direct contact with the carrier collection layer in a direction perpendicular to a thickness direction of the solar cell.

In an embodiment, an area of the amorphous silicon region 26 ranges from 15% to 95% of an area of the etching region 27 in the direction perpendicular to the thickness direction of the solar cell. In an embodiment, the area of the amorphous silicon region 26 ranges from 50% to 95% of the area of the etching region 27. In an embodiment, the area of the amorphous silicon region 26 ranges from 85% to 95% of the area of the etching region 27. In this embodiment of the present application, when the area of the amorphous silicon region 26 is in the foregoing range of the area of the etching region 27, the amorphous silicon region 26 can effectively reduce the contact resistance, so that the photoelectric conversion efficiency of the solar cell is improved.

During actual application, a percentage of the area of the amorphous silicon region 26 in the area of the etching region 27 is specifically set based on a use requirement. For example, the area of the amorphous silicon region 26 is at least one of 15%, 20%, 25%, 30%, 35%, 40%, 45%, 50%, 55%, 60%, 65%, 70%, 75%, 80%, 85%, 90%, or 95% of the area of the etching region 27.

In an embodiment, the area of the etching region 27 is less than or equal to 90% of the area of the polysilicon layer 22 in the direction perpendicular to the thickness direction of the solar cell. A plane on which the etching region 27 is arranged is used to be connected to the transparent conductive layer 40. When the area of the etching region 27 is in the foregoing range of the area of the polysilicon layer 22, a requirement on a contact area between the first transport layer 20 and the transparent conductive layer 40 is satisfied.

In an embodiment, the plane on which the etching region 27 is arranged is lower than or level with a plane that is of the polysilicon layer 22 and that is away from the silicon substrate 10. In this case, the etching region 27 can increase back-surface reflection of front-surface transmission light, to improve a light-absorption efficiency of the solar cell.

When the etching region 27 is arranged on the polysilicon layer 22, the plane on which the etching region 27 is arranged is lower than the plane that is of the polysilicon layer 22 and that is away from the silicon substrate 10, so that parasitic absorption of the polysilicon layer 22 can be reduced, and the light-absorption efficiency is improved. When the plane on which the etching region 27 is arranged is level with a plane that is of the first transport layer 20 and that is away from the silicon substrate 10, although the two planes are level, the amorphous silicon region 26 is arranged on the etching region 27, so that the amorphous silicon region 26 can implement more proper energy-band matching and reduce the contact resistance, thereby improving the photoelectric conversion efficiency of the solar cell. Therefore, the solar cell in this embodiment of the present application has an advantage of a high light-absorption efficiency.

Figures 18, 19:
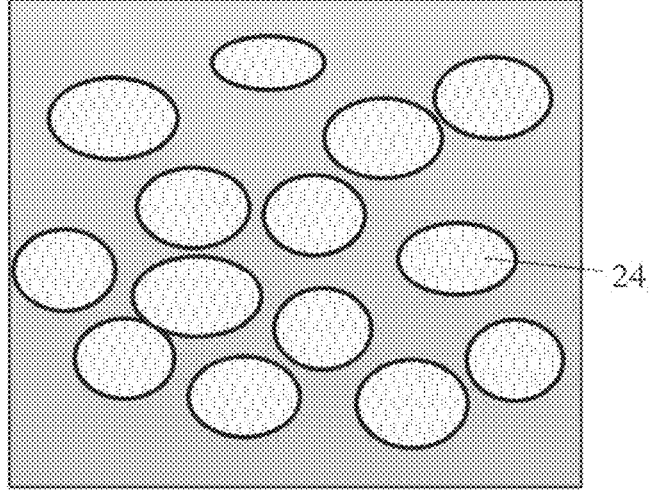
FIG. 18 is a schematic diagram 2 of a structure of particles of a solar cell according to an embodiment of the present application.
FIG. 19 is a schematic diagram of a structure of a solar cell according to an embodiment of the present application.

In an embodiment, as shown in FIG. 19, there is a height difference D between the plane on which the etching region 27 is arranged and the plane that is of the polysilicon layer 22 and that is away from the silicon substrate 10, where 0 nm≤D≤100 nm.

During actual application, the height difference D between the plane on which the etching region 27 is arranged and the plane that is of the polysilicon layer 22 and that is away from the silicon substrate 10 may be selected based on a use requirement. For example, D is 0 nm. 1 nm, 5 nm, 10 nm, 20 nm, 30 nm, 40 nm, 50 nm, 60 nm, 70 nm, 80 nm, 90 nm, or 100 nm.

Figure 13:
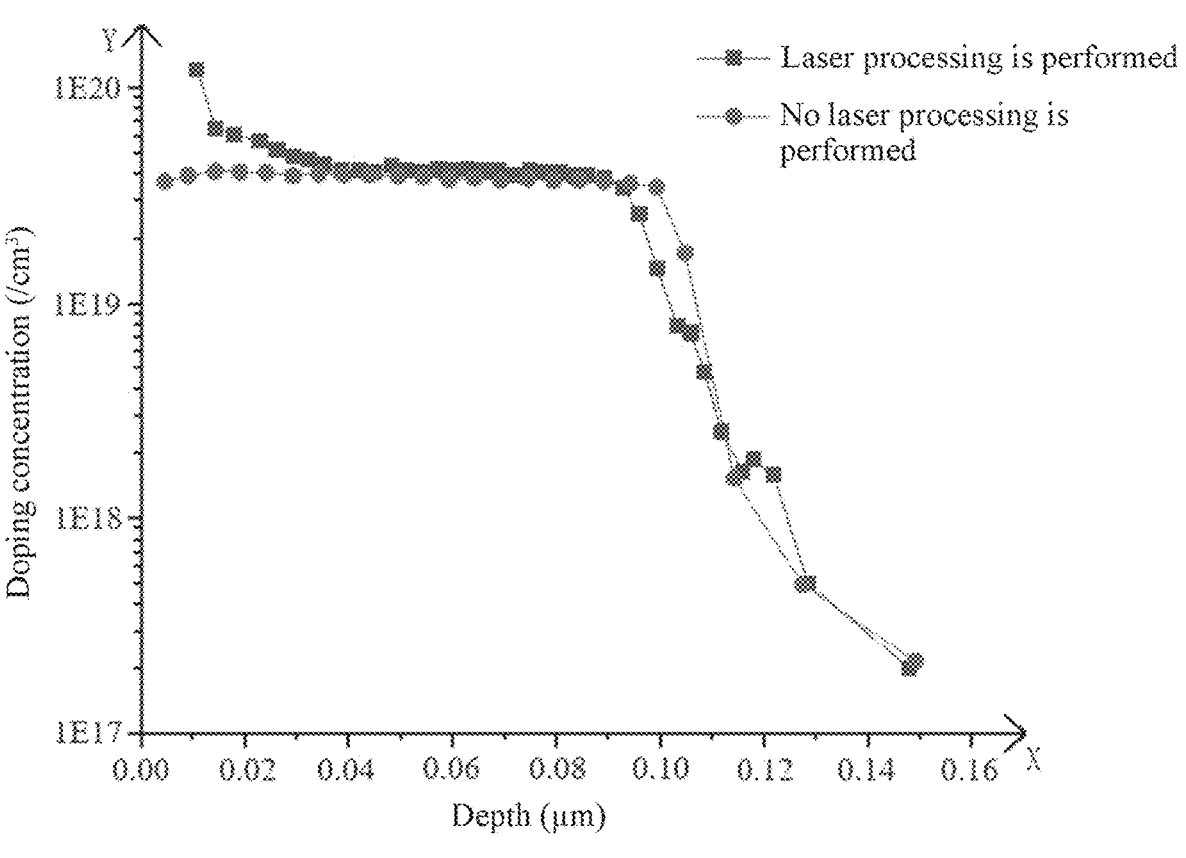
FIG. 13 is a schematic diagram of an electrochemical capacitance-voltage test of a solar cell according to an embodiment of the present application.

In an embodiment, the amorphous silicon region 26 includes a first doping element and/or a second doping element, and/or the polysilicon layer 22 includes the first doping element. A doping concentration of doping elements in the amorphous silicon region 26 is greater than a doping concentration of doping elements in the polysilicon layer 22. As shown in FIG. 13, the doping concentration of the amorphous silicon region 26 of the first transport layer 20 is greater than the doping concentration of the polysilicon layer 22. To be specific, the doping concentration of the amorphous silicon region 26 formed at the first transport layer 20 after laser processing is performed on the polysilicon layer 22 is greater than the doping concentration of the polysilicon layer 22 that is at the first transport layer 20 and on which no laser processing is performed. For example, when a depth is 15 nm, the doping concentration $6.5 \times 1019$ atom quantity/cm3 of the amorphous silicon region 26 is greater than the doping concentration $4 \times 1019$ atom quantity/cm3 of the polysilicon layer 22. For another example, when the depth is 30 nm, the doping concentration $5.5 \times 1019$ atom quantity/cm3 of the amorphous silicon region 26 is greater than the doping concentration $4 \times 1019$ atom quantity/cm3 of the polysilicon layer 22.

In this embodiment of the present application, when the doping concentration of the amorphous silicon region 26 is greater than the doping concentration of the polysilicon layer 22, a doping concentration of a surface of the first transport layer 20 can be improved, to reduce the contact resistance.

One of the first doping element and the second doping element includes at least one of nitrogen, phosphorus, arsenic, antimony, or the like, and the other of the first doping element and the second doping element includes at least one of boron, aluminum, gallium, indium, or the like. When the first doping element includes at least one of nitrogen, phosphorus, arsenic, antimony; or the like, the polysilicon layer 22 is an N-type doped layer. In some solar cells, for example, a solar cell having aluminum oxide and/or silicon nitride as a passivation layer, after laser is applied to the second transport layer 30 to form a contact opening of the carrier collection layer, the second doping element remains, so that the amorphous silicon region 26 includes the second doping element.

In an embodiment, the doping concentration of the amorphous silicon region 26 ranges from $3 \times 1019$ atom quantity/cm3 to $7 \times 1019$ atom quantity/cm3.

During actual application, the doping concentration of the amorphous silicon region 26 is specifically set based on a use requirement. For example, the doping concentration of the amorphous silicon region 26 is $3 \times 1019$ atom quantity/cm3, $3.2 \times 1019$ atom quantity/cm3, $3.4 \times 1019$ atom quantity/cm3, $3.6 \times 1019$ atom quantity/cm3, $3.8 \times 1019$ atom quantity/cm3, $4 \times 1019$ atom quantity/cm3, $4.2 \times 1019$ atom quantity/cm3, $4.4 \times 1019$ atom quantity/cm3, $4.6 \times 1019$ atom quantity/cm3, $4.8 \times 1019$ atom quantity/cm3, $5 \times 1019$ atom quantity/cm3, $5.2 \times 1019$ atom quantity/cm3, $5.4 \times 1019$ atom quantity/cm3, $5.6 \times 1019$ atom quantity/cm3, $5.8 \times 1019$ atom quantity/cm3, $6 \times 1019$ atom quantity/cm3, $6.2 \times 1019$ atom quantity/cm3, $6.4 \times 1019$ atom quantity/cm3, $6.6 \times 1019$ atom quantity/cm3, $6.8 \times 1019$ atom quantity/cm3, or $7 \times 1019$ atom quantity/cm3.

In an embodiment, particles 24 are arranged on the amorphous silicon region 26. In this embodiment of the present application, arrangement of the particles 24 can increase the back-surface reflection of the front-surface transmission light, to improve the light-absorption efficiency of the solar cell.

The particles 24 are formed through laser processing.

In an embodiment, from a top view of the solar cell, a maximum length of the particles 24 is less than 50 nm. In an embodiment, the maximum length of the particles 24 is less than 20 nm. In an embodiment, the maximum length of the particles 24 is less than 15 nm. In an embodiment, the maximum length of the particles 24 ranges from 5 nm to 10 nm. When the size of the particles 24 is within the foregoing range, the particles 24 can increase the back-surface reflection of the front-surface transmission light, to improve the light-absorption efficiency.

Further, when the maximum length of the particles 24 is less than 50 nm, a light refraction effect is good. Further, when the maximum length of the particles 24 is less than 20 nm, the light refraction effect is good, and a contact resistance effect is better than that when the maximum length of the particles 24 is less than 50 nm. More further, when the maximum length of the particles 24 ranges from 5 nm to 10 nm, the light refraction effect and the contact resistance effect are optimal.

Further, from the top view of the solar cell, a value of the maximum length of the particles 24 is not specifically limited in this embodiment of the present application. For example, the maximum length of the particles 24 is 5 nm, 5.5 nm, 6 nm, 6.5 nm, 7 nm, 8 nm, 9 nm, 10 nm, 11 nm, 12 nm, 13 nm, 14 nm, 15 nm, 16 nm, 17 nm, 18 nm, 19 nm, 20 nm, 25 nm, 30 nm, 35 nm, 40 nm, 45 nm, or 50 nm.

In an embodiment, a plurality of particles 24 are arranged on the amorphous silicon region 26. An area coverage rate of the particles 24 in the amorphous silicon region 26 in the direction perpendicular to the thickness direction of the solar cell ranges from 0.01% to 60%. When the area coverage rate of the particles 24 in the amorphous silicon region 26 is within the foregoing range, the particles 24 can increase the back-surface reflection of the front-surface transmission light, to improve the light-absorption efficiency of the solar cell.

In an embodiment, the particles 24 include an element silicon, or the particles 24 include an element silicon and the second doping element. A type of the second doping element included in the particles 24 is different from a type of the first doping element in the polysilicon layer 22.

In this embodiment of the present application, the particles 24 are formed after laser etching, and the particles 24 include the element silicon. Alternatively, the particles 24 include the element silicon and the second doping element, and the second doping element is at least one of group 5 elements. The group 5 elements include nitrogen, phosphorus, arsenic, antimony; or the like. In this case, the first doping element in the polysilicon layer 22 is at least one of group 3 elements, and the group 3 elements include boron, aluminum, gallium, indium, or the like. For example, if the doping element included in the particles 24 is boron, the doping element in the polysilicon layer 22 on which the particles 24 are arranged is phosphorus.

In an embodiment, the particles 24 include fused silicon particles. The particles 24 are formed after laser ablates a second doped layer 32 at the second transport layer 30, the particles 24 include the fused silicon particles, and the silicon particles include the element silicon. Alternatively, the silicon particles include the element silicon and the second doping element.

In an embodiment, the particles 24 each are presented as at least one of a circle, an ellipse, or an irregular pattern from the top view of the solar cell.

Figure 17:
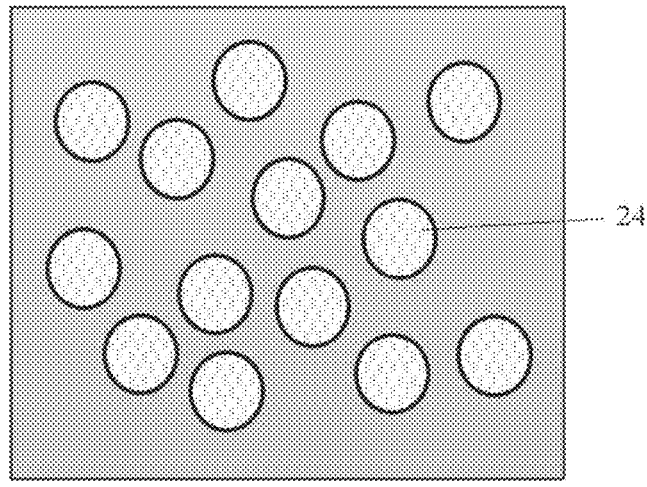
FIG. 17 is a schematic diagram 1 of a structure of particles of a solar cell according to an embodiment of the present application.

Further. FIG. 17 is a schematic diagram of a structure in which the particles 24 each are presented as a circle. FIG. 18 is a schematic diagram of a structure in which the particles 24 each are presented as an ellipse.

In an embodiment, the particles 24 are embedded in the amorphous silicon region 26; and/or the particles 24 are embedded at the polysilicon layer 22; and/or a part of the particles 24 are embedded in the amorphous silicon region 26, and the remaining part of the particles 24 are embedded at the polysilicon layer 22. A depth by which the particles 24 are embedded on a plane on which a surface that is of the amorphous silicon region 26 and that is away from the silicon substrate 10 is arranged ranges from 0) nm to 200 nm.

In this embodiment of the present application, the depth by which the particles 24 are embedded on the plane on which the surface that is of the amorphous silicon region 26 and that is away from the silicon substrate 10 is arranged is set based on a use requirement. For example, the depth by which the particles 24 are embedded is 0 nm. 5 nm. 10 nm. 40 nm. 50 nm. 80 nm. 100 nm. 135 nm. 150 nm. 160 nm. 180 nm, or 200 nm.

In an embodiment, in the thickness direction of the solar cell. 10% to 100% of the particles 24 are embedded on the plane on which the surface that is of the amorphous silicon region 26 and that is away from the silicon substrate 10 is arranged.

Figure 16:
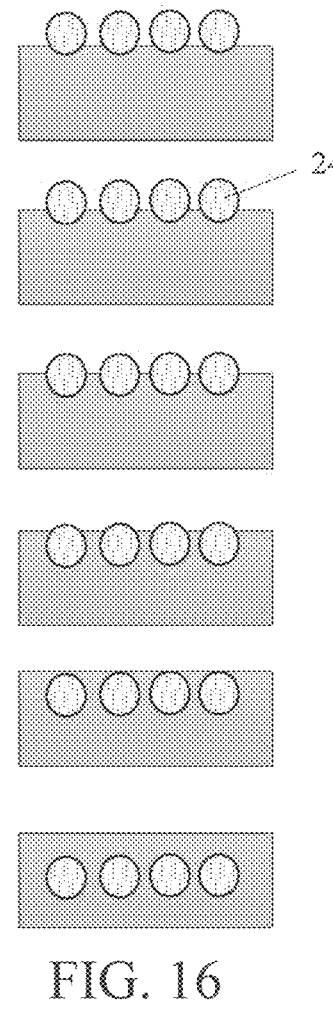
FIG. 16 is a schematic diagram of a structure in which particles are embedded in a plane on which an etching region is arranged in a solar cell according to an embodiment of the present application.

In this embodiment of the present application, further referring to FIG. 16, in a direction from the top to the bottom, a first figure shows that 10% of the particles 24 are embedded on the plane on which the surface that is of the amorphous silicon region 26 and that is away from the silicon substrate 10 is arranged: a second figure shows that 25% of the particles 24 are embedded on the plane on which the surface that is of the amorphous silicon region 26 and that is away from the silicon substrate 10 is arranged: a third figure shows that 50% of the particles 24 are embedded on the plane on which the surface that is of the amorphous silicon region 26 and that is away from the silicon substrate 10 is arranged: a fourth figure shows that 75% of the particles 24 are embedded on the plane on which the surface that is of the amorphous silicon region 26 and that is away from the silicon substrate 10 is arranged: a fifth figure shows that 100% of the particles 24 are embedded on the plane on which the surface that is of the amorphous silicon region 26 and that is away from the silicon substrate 10 is arranged; and a sixth figure shows that all of the particles 24 are embedded on the plane on which the surface that is of the amorphous silicon region 26 and that is away from the silicon substrate 10 is arranged. When 10% to 100% of the particles 24 are embedded on the plane on which the surface that is of the amorphous silicon region 26 and that is away from the silicon substrate 10 is arranged, the particles 24 are embedded in the amorphous silicon region 26: or the particles 24 are embedded at the polysilicon layer 22: or a part of the particles 24 are embedded in the amorphous silicon region 26, and the remaining part of the particles 24 are embedded at the polysilicon layer 22.

In an embodiment, the carrier collection layer further includes a transparent conductive layer 40. The transparent conductive layer 40 is at least connected to a part of the surface that is of the polysilicon layer 22 and that is away from the silicon substrate 10, at least connected to a part of the surface that is of the amorphous silicon region 26 and that is away from the silicon substrate 10, and at least connected to a part of a surface that is of the second transport layer 30 and that is away from the silicon substrate 10.

The transparent conductive layer 40 may completely cover and be connect to the surface that is of the polysilicon layer 22 and that is away from the silicon substrate 10, that is, the amorphous silicon region 26 in the polysilicon layer 22 is also covered by and connected to the transparent conductive layer 40. In addition, the transparent conductive layer 40 may further completely cover and be connect to the surface that is of the second transport layer 30 and that is away from the silicon substrate 10.

Alternatively, the transparent conductive layer 40 may cover and be connected to a part of the surface that is of the polysilicon layer 22 and that is away from the silicon substrate 10, and may simultaneously cover and be connected to a part of the surface that is of the amorphous silicon region 26 and that is away from the silicon substrate 10. In addition, the transparent conductive layer 40 may further cover and be connect to a part of the surface that is of the second transport layer 30 and that is away from the silicon substrate 10.

The transparent conductive layer 40 (TCO, Transparent Conductive Oxide) has a good transparency and conductibility. The transparent conductive layer directly faces the sunlight. A main function of the transparent conductive layer 40 is to allow the sunlight to pass through and enter the interior of the solar cell, and the transparent conductive layer 40 provides a good photo-generated carrier collection layer.

In this embodiment of the present application, the transparent conductive layer 40 is connected to a part of the surface that is of the amorphous silicon region 26 and that is away from the silicon substrate 10. A work function difference between the amorphous silicon region 26 and the transparent conductive layer 40 is less than a work function difference between the polysilicon layer 22 and the transparent conductive layer 40, in other words, a contact barrier between the amorphous silicon region 26 and the transparent conductive layer 40 is less than a contact barrier between the polysilicon layer 22 and the transparent conductive layer 40, so that a contact resistance between the transparent conductive layer 40 and the amorphous silicon region 26 is less than a contact resistance between the transparent conductive layer 40 and the polysilicon layer 22. Therefore, the contact resistance can be reduced, and the photoelectric conversion efficiency of the solar cell is effectively improved.

In addition, when the transparent conductive layer 40 is arranged through magnetron sputtering, the amorphous silicon region 26 can improve a capability of the first transport layer 20 for resisting a damage cause by bombardment of the magnetron sputtering, to avoid a damage caused by the magnetron sputtering to the polysilicon layer 22, and prevent the damage caused by the bombardment of the magnetron sputtering from affecting the photoelectric conversion efficiency of the solar cell.

In an embodiment, an end portion that is of the first transport layer 20 and that is close to the second transport layer 30 and an end portion that is of the second transport layer 30 and that is close to the first transport layer 20 are laminated to form a laminated portion 50. The end portion of the first transport layer 20 is arranged between the corresponding end portion of the second transport layer 30 and the first surface 11. The carrier collection layer further includes a transparent conductive layer 40. The transparent conductive layer 40 is at least connected to a part of a surface that is of the first transport layer 20 and that is away from the silicon substrate 10, and at least connected to a part of a surface that is of the second transport layer 30 and that is away from the silicon substrate 10. The transparent conductive layer 40 has a second opening 92, and the second opening 92 is configured to break electrical connection between the first transport layer 20 and the second transport layer 30.

The second opening 92 disconnects an N region from a P region. The second opening 92 may be used for insulation between the N region and the P region, and has advantages of good insulation reliability and a good insulation effect.

In an embodiment, there is an isolation region between the first transport layer 20 and the second transport layer 30. The carrier collection layer further includes a transparent conductive layer 40. The transparent conductive layer 40 is at least connected to a part of a surface that is of the first transport layer 20 and that is away from the silicon substrate 10, and at least connected to a part of a surface that is of the second transport layer 30 and that is away from the silicon substrate 10. The transparent conductive layer 40 has a third opening, and the third opening is configured to break electrical connection between the first transport layer 20 and the second transport layer 30. In the foregoing structure of the present application, the third opening also enables the N region to be insulated from the P region, and has advantages of good insulation reliability and a good insulation effect.

In an embodiment, the second transport layer 30 includes a polysilicon layer. The polysilicon layer of the second transport layer 30 has an amorphous silicon region of the second transport layer 30. The amorphous silicon region of the second transport layer 30 is arranged on at least a part of a surface that is of the polysilicon layer of the second transport layer 30 and that is away from the silicon substrate 10. The carrier collection layer is arranged on the second transport layer 30, and at least a part of the carrier collection layer is in contact with the amorphous silicon region of the second transport layer 30.

In this embodiment of the present application, the amorphous silicon region of the first transport layer 20 and the amorphous silicon region of the second transport layer 30 are separately in contact with the carrier collection layer. A work function difference between the amorphous silicon region 26 and the carrier collection layer is less than a work function difference between the polysilicon layer 22 and the carrier collection layer, in other words, a contact barrier between the amorphous silicon region 26 and the carrier collection layer is less than a contact barrier between the polysilicon layer 22 and the carrier collection layer, so that a contact resistance between the amorphous silicon region 26 and the carrier collection layer is less than a contact resistance between the polysilicon layer 22 and the carrier collection layer. The amorphous silicon region 26 can implement more proper energy-band matching and reduce the contact resistance, so that the solar cell can effectively convert the sunlight into electric energy, and the photoelectric conversion efficiency of the solar cell is improved.

In an embodiment, an end portion that is of the first transport layer 20 and that is close to the second transport layer 30 and an end portion that is of the second transport layer 30 and that is close to the first transport layer 20 are laminated to form a laminated portion 50. The end portion of the first transport layer 20 is arranged between the end portion of the second transport layer 30 and the first surface 11. The second transport layer 30 includes a laminated layer of an intrinsic amorphous silicon region and a doped amorphous silicon region. The doped amorphous silicon region covering the end portion of the first transport layer 20 has a hole structure.

In this embodiment of the present application, after laser is applied to the polysilicon layer 22, the doped amorphous silicon region in a range of a region affected by heat of the laser is affected by the heat, and holes are generated, and hole structures with different sizes are generated in the doped amorphous silicon region. The hole structures cause a loose structure of the doped amorphous silicon region, and enhances insulation between the polysilicon layer 22 and the doped amorphous silicon region, so that electric leakage can be reduced.

Figures 9, 10:
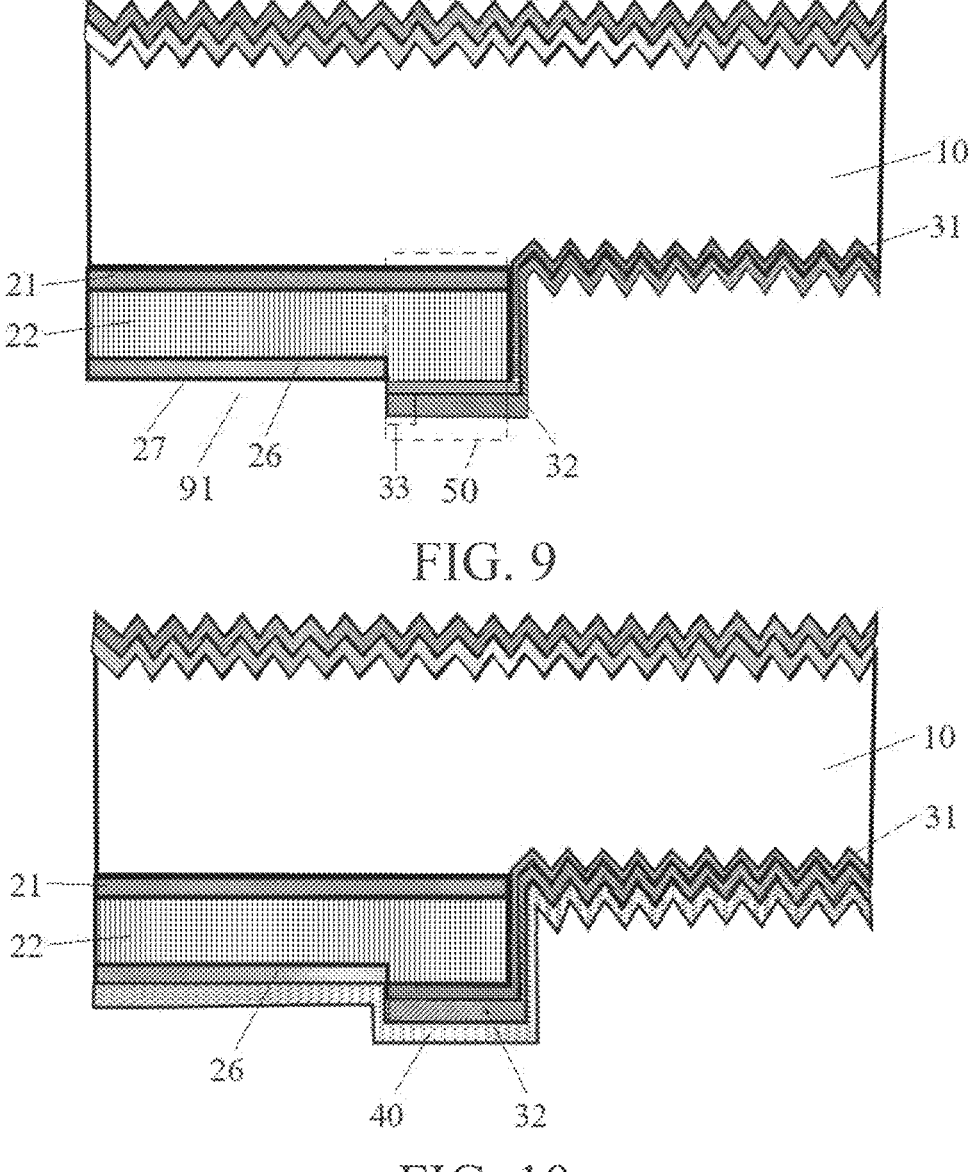

In an embodiment, a width of the doped amorphous silicon region having the hole structure ranges from 0.1 μm to 20 μm in an extension direction of the first surface 11 of the silicon substrate 10 (FIG. 9 is a schematic diagram of a region 33 in which the hole structure in the doped amorphous silicon region is arranged). When the width in this embodiment of the present application is within the foregoing range, electron flowing between the first transport layer 20 and the doped amorphous silicon region can be effectively reduced, to reduce the electric leakage.

It may be understood that the width of the doped amorphous silicon region having the hole structure is set based on a use requirement. For example, the width is 0.1 μm, 0.3 μm, 0.5 μm, 0.7 μm, 0.9 μm, 1 μm, 2 μm, 3 μm, 5 μm, 7 μm, 9 μm, 10 μm, 12 μm, 14 μm, 15 μm, 17 μm, 18 μm, or 20 μm.

In an embodiment, a shape of the hole structure is at least one of a circle, an ellipse, or an irregular pattern from a top view of the solar cell. In addition, when the shape of the hole structure is at least one of a circle, an ellipse, or an irregular pattern, the hole structure can enhance the insulation and reduce the electric leakage.

In an embodiment, the carrier collection layer is arranged on the first transport layer 20, and the carrier collection layer is in contact with the entire amorphous silicon region 26 of the first transport layer 20. Carriers in the entire amorphous silicon region 26 may be directly vertically derived through the carrier collection layer, so that a lateral transport path of the carriers at the carrier collection layer is reduced, a transport resistance is decreased, and a current transport efficiency is improved.

In an embodiment, when the carrier collection layer is a laminated combination of a transparent conductive layer 40 and a metal electrode layer, the transparent conductive layer 40 is closer to the silicon substrate 10 than the metal electrode layer. A projection of the transparent conductive layer 40 on a surface of the silicon substrate 10 covers the entire amorphous silicon region 26 of the first transport layer 20, and a projection of the metal electrode layer on the surface of the silicon substrate 10 at least covers a part of the amorphous silicon region 26 of the first transport layer 20 in a thickness direction of the solar cell. Alternatively, when the carrier collection layer is a metal electrode layer, a projection of the metal electrode layer on a surface of the silicon substrate 10 covers the entire amorphous silicon region 26 of the first transport layer 20 in a thickness direction of the solar cell.

In an embodiment, when the carrier collection layer is the laminated combination of the transparent conductive layer 40 and the metal electrode layer, the transparent conductive layer 40 is closer to the silicon substrate 10. The projection of the metal electrode layer on the surface of the silicon substrate 10 at least covers a part of the amorphous silicon region 26 of the first transport layer 20 in the thickness direction of the solar cell, or the projection of the metal electrode layer on the surface of the silicon substrate 10 covers the entire amorphous silicon region 26 of the first transport layer 20 in the thickness direction of the solar cell. Alternatively: the projection of the transparent conductive layer 40 on the surface of the silicon substrate 10 at least covers a part of the amorphous silicon region 26 of the first transport layer 20 in the thickness direction of the solar cell, or the projection of the transparent conductive layer 40 on the surface of the silicon substrate 10 covers the entire amorphous silicon region 26 of the first transport layer 20 in the thickness direction of the solar cell.

In this embodiment of the present application, when the projection of the metal electrode layer on the surface of the silicon substrate 10 at least covers a part of the amorphous silicon region 26 of the first transport layer 20, carriers in the amorphous silicon region may be directly vertically derived successively through the transparent conductive layer 40 and the metal electrode layer, so that a lateral transport path of the carriers at the transparent conductive layer 40 is reduced, a transport resistance is decreased, and a current transport efficiency is improved.

Further, when the projection of the metal electrode layer on the surface of the silicon substrate 10 covers the entire amorphous silicon region 26 of the first transport layer 20, the metal electrode layer covers the entire amorphous silicon region, so that the transport path of the carriers in the amorphous silicon region can be further reduced.

In an embodiment, the metal electrode layer includes at least one or a laminated combination of a conductive slurry layer, a metal layer, and a metal alloy layer. The metal layer may alternatively be specifically set based on a use requirement. For example, the metal layer includes a single-layer structure formed by using single metal, a multi-layer structure of a same metal material, or a multi-layer structure of different metal materials.

In an embodiment, as shown in FIG. 1 to FIG. 12, the solar cell further comprises a first electrode 61 and a second electrode 62. The first electrode 61 is arranged on the transparent conductive layer 40 on the surface that is of the first transport layer 20 and that is away from the silicon substrate 10, and the second electrode 62 is arranged on the transparent conductive layer 40 on the surface that is of the second transport layer 30 and that is away from the silicon substrate 10. The first electrode 61 and the transparent conductive layer 40 jointly form the carrier collection layer of the first transport layer 20. The second electrode 62 and the transparent conductive layer 40 jointly form the carrier collection layer of the second transport layer 30. In this case, the carriers in the amorphous silicon region at the first transport layer 20 may be directly vertically derived successively through the transparent conductive layer 40 and the first electrode 61, so that the lateral transport path of the carriers at the transparent conductive layer 40 is reduced, the transport resistance is decreased, and the current transport efficiency is improved.

Further, when the amorphous silicon region is arranged on the second transport layer 30, the carriers in the amorphous silicon region at the second transport layer 30 may be directly vertically derived successively through the transparent conductive layer 40 and the second electrode 62, so that the lateral transport path of the carriers at the transparent conductive layer 40) is reduced, the transport resistance is decreased, and the current transport efficiency is improved.

Further, as shown in FIG. 9 and FIG. 12, the first electrode 61 and the second electrode 62 are both arranged parallel to an extension direction of the laminated portion 50, and are arranged spaced away in the first direction A.

In an embodiment, as shown in FIG. 1 to FIG. 12, the solar cell further includes an anti-reflection layer 80 and a third passivation layer 70. The anti-reflection layer 80 and the third passivation layer 70 are successively laminated on the second surface 12 of the solar cell.

In the solar cell in this embodiment of the present application, the first transport layer 20 includes the polysilicon layer 22 and the amorphous silicon region 26 that are laminated. The polysilicon layer 22 is arranged on the first surface 11 of the silicon substrate 10. The amorphous silicon region 26 is arranged on at least a part of the surface that is of the polysilicon layer 22 and that is away from the silicon substrate 10, and is formed by laser. The laser forms the amorphous silicon region 26 on at least a part of the surface that is of the polysilicon layer 22 and that is away from the silicon substrate 10. A work function difference between the amorphous silicon region 26 and the carrier collection layer is less than a work function difference between the polysilicon layer and the carrier collection layer, in other words, a contact barrier between the amorphous silicon region and the carrier collection layer is less than a contact barrier between the polysilicon layer and the carrier collection layer, so that a contact resistance between the amorphous silicon region 26 and the carrier collection layer is less than a contact resistance between the polysilicon layer 22 and the carrier collection layer. The amorphous silicon region 26 can implement more proper energy-band matching and reduce a contact resistance, so that the solar cell can effectively convert the sunlight into electric energy, and a photoelectric conversion efficiency of the solar cell is improved.

Further, in the solar cell, crystalline silicon/amorphous silicon heterojunction contact has advantages of good passivation performance and a high open-circuit voltage. The crystalline silicon/amorphous silicon heterojunction contact is suitable for serving as an emitter, that is, a P region of the solar cell. Tunnel oxide passivated contact has an advantage of a lower contact resistance. The tunnel oxide passivated contact is suitable for serving as a back surface field, that is, an N region of the solar cell. Therefore, the hybridized solar cell using the crystalline silicon/amorphous silicon heterojunction contact and the tunnel oxide passivated contact has higher potential in a photoelectric conversion efficiency. The P region may be understood as including a boron-doped amorphous layer, and the N region may be understood as including a phosphorus-doped polycrystal layer. When the P region uses the crystalline silicon/amorphous silicon heterojunction contact, a transparent conductive layer 40 (for example, the transparent conductive layer 40 is an indium tin oxide material layer, or the transparent conductive layer 40 is a photo-generated carrier collection layer) is usually deposited on surfaces that are of the P region and the N region and that are away from the silicon substrate 10. The transparent conductive layer 40 is in contact with an amorphous silicon region 26 of the N region, and can reduce a contact resistance of the N region from a plurality of aspects.

First, a doping concentration of doping elements of the amorphous silicon region of the N region is greater than a doping concentration of doping elements of a polysilicon layer of the N region. Because the doping concentration increases, the contact resistance between the transparent conductive layer 40 and the N region is reduced. Second, there is the amorphous silicon region at the polysilicon layer of the N region. Energy-band matching between the transparent conductive layer and amorphous silicon is more proper than energy-band matching between the transparent conductive layer and polycrystalline silicon (where specifically, because a work function difference between the amorphous silicon region and the transparent conductive layer is less than a work function difference between the polysilicon layer and the transparent conductive layer, in other words, a contact barrier between the amorphous silicon region and the transparent conductive layer is less than a contact barrier between the polysilicon layer and the transparent conductive layer, the energy-band matching between the transparent conductive layer and the amorphous silicon region is more proper than the energy-band matching between the transparent conductive layer and the polysilicon layer). In addition, a damage caused to the polysilicon layer 22 of the N region when the transparent conductive layer 40 is deposited through magnetron sputtering is avoided. Therefore, the solar cell has an advantage of a high photoelectric conversion efficiency.

The present application further provides a manufacturing method for a solar cell. As shown in FIG. 1 to FIG. 12, the manufacturing method includes the following steps.

S01: Provide a silicon substrate 10, where the silicon substrate 10 has a first surface 11 and a second surface 12, and the first surface 11 is arranged opposite to the second surface 12.

In this step, the provided silicon substrate 10 needs to be polished and cleaned, to remove layers that are of the first surface 11 and the second surface 12 of the silicon substrate 10 and that are damaged during cutting, and polishing topographies of the first surface 11 and the second surface 12 are adjusted by controlling a temperature, duration, and a liquid concentration of the polishing and cleaning.

S02: Form a first transport layer 20 on at least one of the first surface 11 and the second surface 12, where the first transport layer 20 includes a polysilicon layer 22.

In this step, the first transport layer 20 and the second transport layer 30 are arranged on the first surface 11. An end portion that is of the first transport layer 20 and that is close to the second transport layer 30 and an end portion that is of the second transport layer 30 and that is close to the first transport layer 20 are laminated to form a laminated portion 50. The end portion of the first transport layer 20 is arranged between the end portion of the second transport layer 30 and the first surface 11, and the polysilicon layer 22 is connected to the end portion of the second transport layer 30.

S03: Form an amorphous silicon region of the first transport layer on at least a part of a surface that is of the polysilicon layer of the first transport layer and that is away from the silicon substrate.

In this step, a part of the second transport layer 30 at the polysilicon layer 22 is selectively removed through laser processing to form a first opening 91, and laser processing is performed on polycrystalline silicon at the first opening 91, so that the polycrystalline silicon at a surface layer is converted into amorphous silicon to form the amorphous silicon region 26. A laser transmitter used during the laser processing is a pico-laser transmitter.

S04: Form a carrier collection layer at the first transport layer, where at least a part of the carrier collection layer is in contact with the amorphous silicon region of the first transport layer.

Further, in this embodiment, the carrier collection layer is a transparent conductive layer 40.

In the solar cell manufactured by using the manufacturing method for a solar cell, a work function difference between the amorphous silicon region 26 and the carrier collection layer is less than a work function difference between the polysilicon layer 22 and the carrier collection layer, in other words, a contact barrier between the amorphous silicon region 26 and the carrier collection layer is less than a contact barrier between the polysilicon layer 22 and the carrier collection layer, so that a contact resistance between the amorphous silicon region 26 and the carrier collection layer is less than a contact resistance between the polysilicon layer 22 and the carrier collection layer. The amorphous silicon region 26 can implement more proper energy-band matching and reduce a contact resistance, so that the solar cell can effectively convert the sunlight into electric energy, and a photoelectric conversion efficiency of the solar cell is improved.

An embodiment of the present application further provides a photovoltaic module. The photovoltaic module includes a cover plate, a back sheet, and a solar cell arranged between the cover plate and the back sheet. The solar cell includes the foregoing solar cell.

Whether the photovoltaic module includes another structure is not specifically limited in this embodiment of the present application. For example, the photovoltaic module may further include a first encapsulation adhesive film arranged between the cover plate and the solar cell and a second encapsulation adhesive film arranged between the back sheet and the solar cell.

In the photovoltaic module, a first transport layer 20 of the solar cell includes a polysilicon layer 22 and an amorphous silicon region 26 that are laminated. The polysilicon layer 22 is arranged on a first surface 11 of a silicon substrate 10. The amorphous silicon region 26 is arranged on at least a part of a surface that is of the polysilicon layer 22 and that is away from the silicon substrate 10, and is formed by laser. The laser forms the amorphous silicon region 26 on at least a part of the surface that is of the polysilicon layer 22 and that is away from the silicon substrate 10. Because a contact resistance between the amorphous silicon region 26 and a transparent conductive layer 40 is less than a contact resistance between the polysilicon layer 22 and the transparent conductive layer 40, the amorphous silicon region 26 can implement more proper energy-band matching and reduce a contact resistance, so that the solar cell can effectively convert the sunlight into electric energy, and a photoelectric conversion efficiency of the solar cell is improved.

The present application is further described in detail below with reference to specific embodiments.

Embodiment 1

As shown in FIG. 1 to FIG. 12, a preparation process for a solar cell includes the following steps.

Step 101: As shown in FIG. 1, polish and clean a silicon substrate 10.

In this step, the silicon substrate 10 is put into a polishing and cleaning machine such as a tank polishing and cleaning machine for polishing and cleaning, to remove layers that are of the first surface 11 and the second surface 12 of the silicon substrate 10 and that are damaged during cutting, and polishing topographies of the first surface 11 and the second surface 12 are adjusted by controlling a temperature, duration, and a liquid concentration of the polishing and cleaning.

Figure 2:
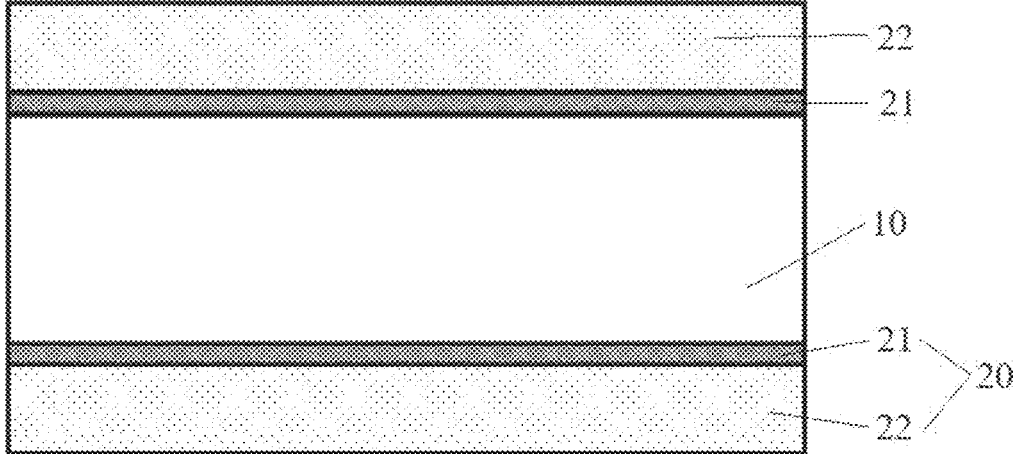

Step 102: As shown in FIG. 2, separately form a first transport layer 20 on a first surface 11 and a second surface 12 of the silicon substrate 10.

In this step, the first transport layer 20 is a first passivation layer 21 and a polysilicon layer 22 that are laminated, and the first passivation layer 21 is connected to the first surface 11 and the polysilicon layer 22, or the first passivation layer 21 is connected to the second surface 12 and the polysilicon layer 22.

Specifically, a low pressure chemical vapor deposition (LPCVD, Low Pressure Chemical Vapor Deposition) device may be used to successively deposit the first passivation layer 21 and the polysilicon layer 22 on the first surface 11, and successively deposit the first passivation layer 21 and the polysilicon layer 22 on the second surface 12. The silicon substrate 10 is an N-type silicon substrate, the first passivation layer 21 includes a silicon oxide layer, and a thickness range of the silicon oxide layer is 1.4 nm. The polysilicon layer 22 is an intrinsic semiconductor material layer, and a thickness range of the polysilicon layer 22 is 150 nm.

In this step, the first transport layer 20 may be separately formed on the first surface 11 and the second surface 12 through deposition by the LPCVD device, and the first transport layer 20 on the first surface 11 and the first transport layer 20 on the second surface 12 are symmetrically arranged. Alternatively, the first transport layer 20 may be formed on only the first surface 11 through deposition by the LPCVD device.

Figure 3:
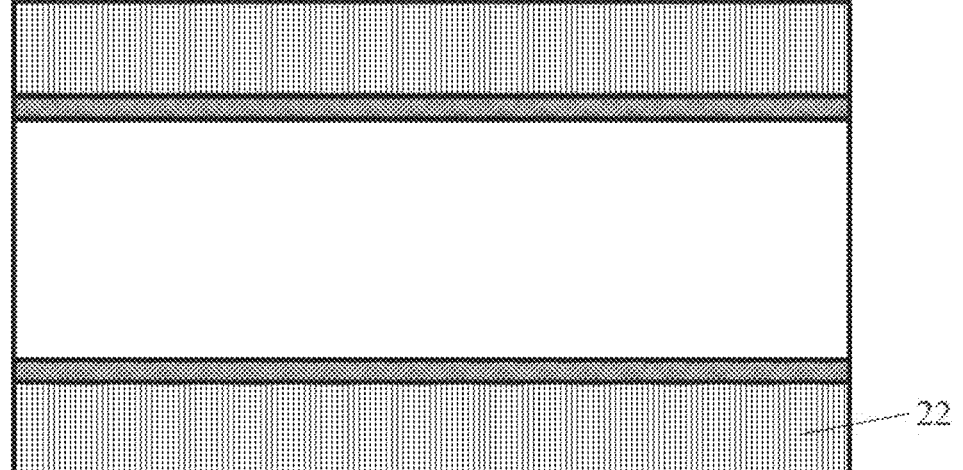

Step 103: As shown in FIG. 3, perform doping on the polysilicon layer 22 arranged on the first surface 11.

Figure 5:
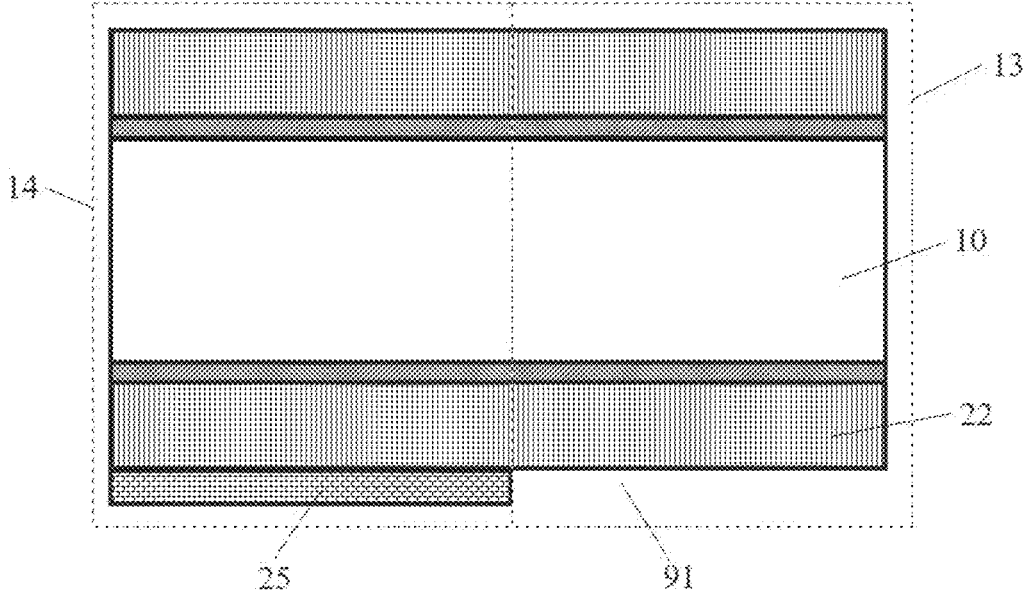

In this step, doping of an element phosphorus is performed on the polysilicon layer 22 on the first surface 11 through high-temperature diffusion, so that a first doped portion is formed in a part that is of the polysilicon layer 22 on the first surface 11 and that corresponds to a first region 13 (referring to FIG. 5), and a second doped portion is formed in a part corresponding to a second region 14 (referring to FIG. 5). Then, a phosphosilicate glass layer formed after phosphorus diffusion is removed through a wet etching process by using a hydrogen fluoride solution (HF solution). In this step, a change of the polysilicon layer 22 on the second surface 12 may be ignored. An N region is formed after doping is performed on the polysilicon layer 22 arranged on the first surface 11.

Figure 4:
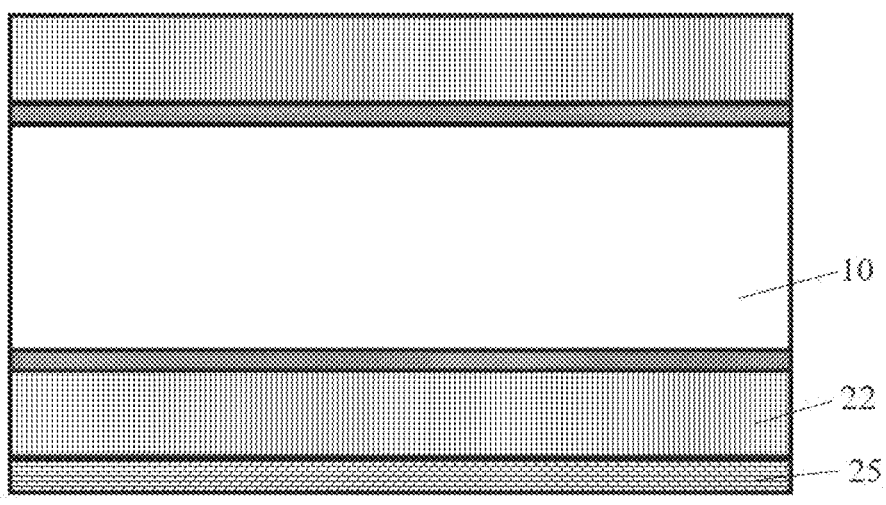

Step 104: As shown in FIG. 4, form a mask on a surface that is of the polysilicon layer 22 and that is away from the silicon substrate 10.

In this step, a first silicon nitride material layer is deposited, as the mask 25, on the surface that is of the polysilicon layer 22 on the first surface 11 and that is away from the silicon substrate 10. The first silicon nitride material layer is formed through a plasma chemical vapor deposition process, and a thickness of the first silicon nitride material layer is 60 nm.

Step 105: As shown in FIG. 5, remove the mask in the first region 13 on the first surface 11.

In this step, the first silicon nitride material layer in the first region 13 on the first surface 11 is selectively removed through laser processing. A laser transmitter used during the laser processing is a pico-laser transmitter of 532 nm.

Figure 6:
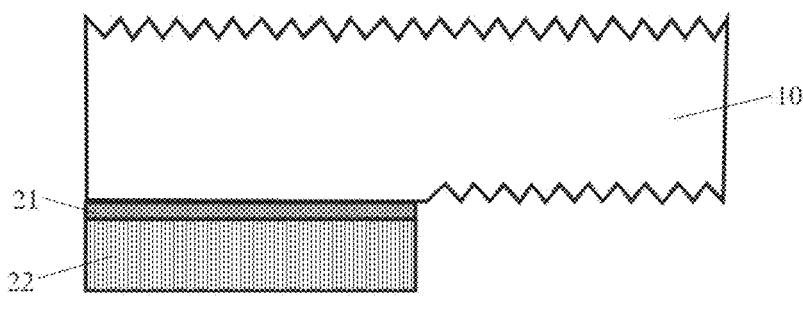

Step 106: As shown in FIG. 6, separately perform texturing processing on the first region 13 on the first surface 11 and the second surface 12.

In this step, under the action of the first silicon nitride material layer, texturing processing is performed on a surface on which the first region 13 on the first surface 11 of the silicon substrate 10 is arranged and the second surface 12, to form textured surfaces on the surface on which the first region 13 on the first surface 11 is arranged and the second surface 12, so as to improve an efficiency of absorbing the sunlight by the solar cell. Then, the first silicon nitride material layer is removed by using a hydrofluoric acid solution.

Figure 7:
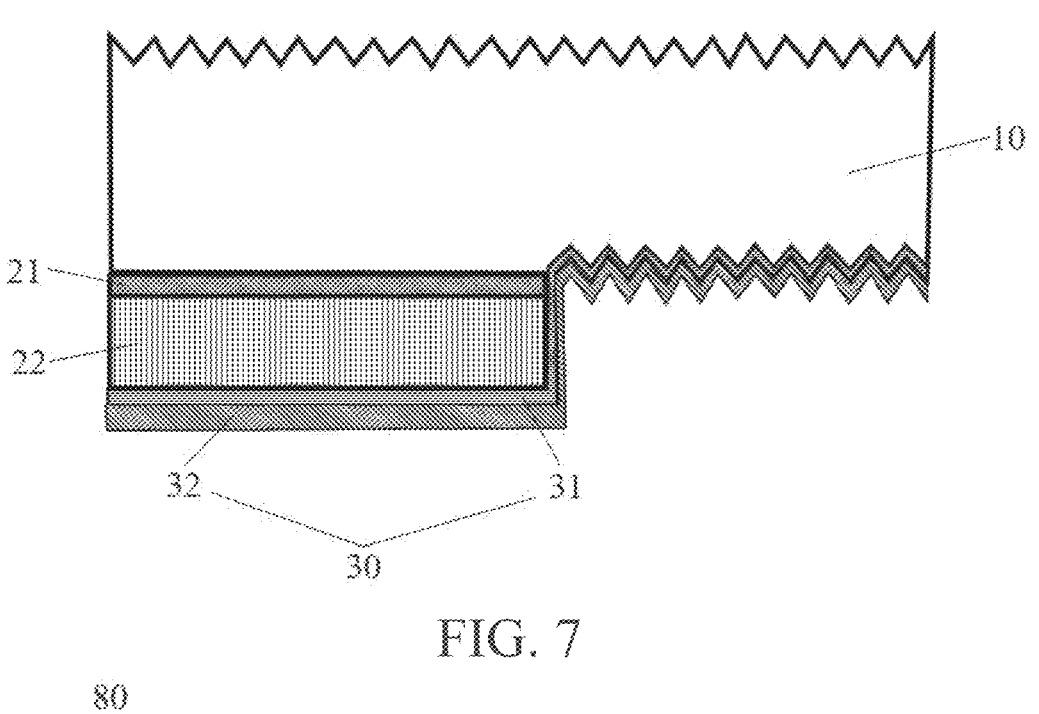

Step 107: As shown in FIG. 7, form a second transport layer 30 on the first surface 11 of the silicon substrate 10.

In this step, the entire second transport layer 30 is formed on the first surface 11 of the silicon substrate 10. The second transport layer 30 includes a second passivation layer 31 and a second doped layer 32 that are laminated, and the second passivation layer 31 is connected between the first surface 11 and the second doped layer 32.

Specifically, a chemical vapor deposition (CVD, Chemical Vapor Deposition) device may be used to successively deposit the second passivation layer 31 and the second doped layer 32. The second passivation layer 31 includes an intrinsic amorphous silicon region, the second doped layer 32 includes a P-type amorphous silicon region, and a thickness of the second doped layer 32 is 15 nm.

Figure 8:
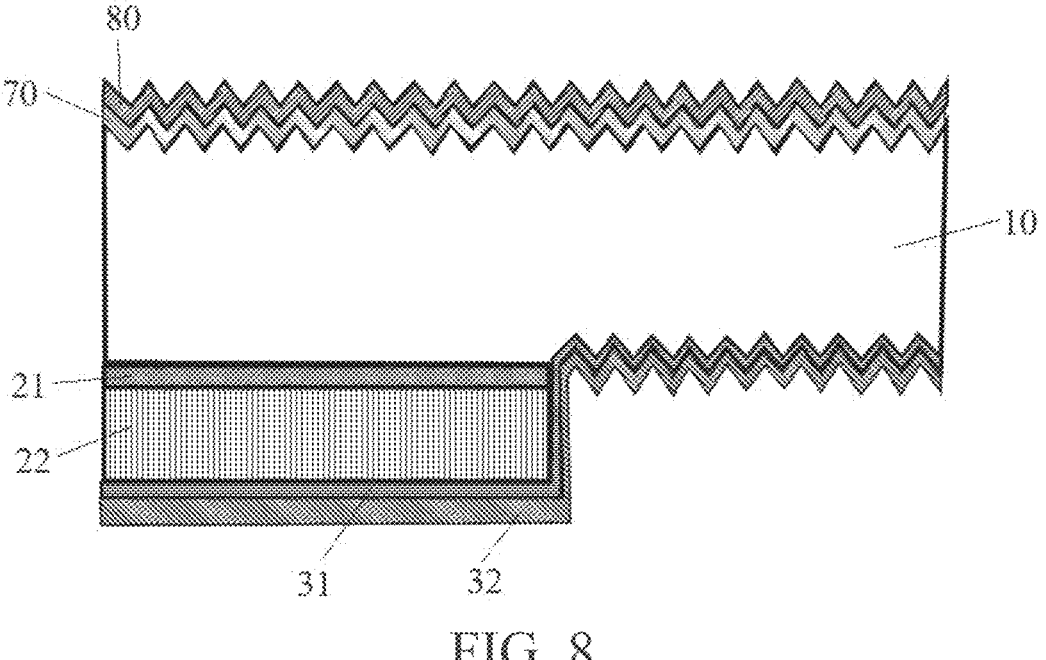

Step 108: As shown in FIG. 8, form a third passivation layer 70 and an anti-reflection layer 80 on the second surface 12 of the silicon substrate 10.

In this step, a CVD device may be used to deposit the third passivation layer 70 on the second surface 12 of the silicon substrate 10, the third passivation layer 70 is an intrinsic amorphous silicon material layer, and a thickness range of the third passivation layer 70 is 5 nm. The anti-reflection layer 80 is deposited on a surface that is of the third passivation layer 70 and that is away from the silicon substrate 10. The anti-reflection layer 80 is a second silicon nitride material layer, and a thickness of the second silicon nitride material layer is 70 nm.

Step 109: As shown in FIG. 9, remove the second passivation layer 31 and the second doped layer 32 in the second region 14 of the silicon substrate 10 by using laser.

In this step, most or all of the second doped layer 32 and the second passivation layer 31 in the second region 14 on the first surface 11 of the silicon substrate 10 are selectively removed through laser processing, to form a first opening 91. The polysilicon layer 22 of the first opening 91 is processed by using laser, so that polycrystalline silicon at a surface layer is converted into amorphous silicon to form the amorphous silicon region 26. A thickness of the amorphous silicon region 26 ranges from 3% to 30% of a thickness of the polysilicon layer 22. A laser transmitter used during the laser processing is a pico-laser transmitter of 532 nm.

In this step, when the second doped layer 32 and the second passivation layer 31 in the second region 14 on the first surface 11 of the silicon substrate 10 are selectively removed through the laser processing, particles 24 remain in the amorphous silicon region 26. The particles 24 can increase back-surface reflection of front-surface transmission light.

Step 110: As shown in FIG. 10, deposit a transparent conductive layer 40 on a side that is of the silicon substrate 10 and on which the first surface 11 is arranged.

In this step, the transparent conductive layer 40 is entirely arranged, through magnetron sputtering, on the side that is of the silicon substrate 10 and on which the first surface 11 is arranged, and a thickness of the transparent conductive layer 40 ranges from 20 nm to 100 nm.

Figure 14:
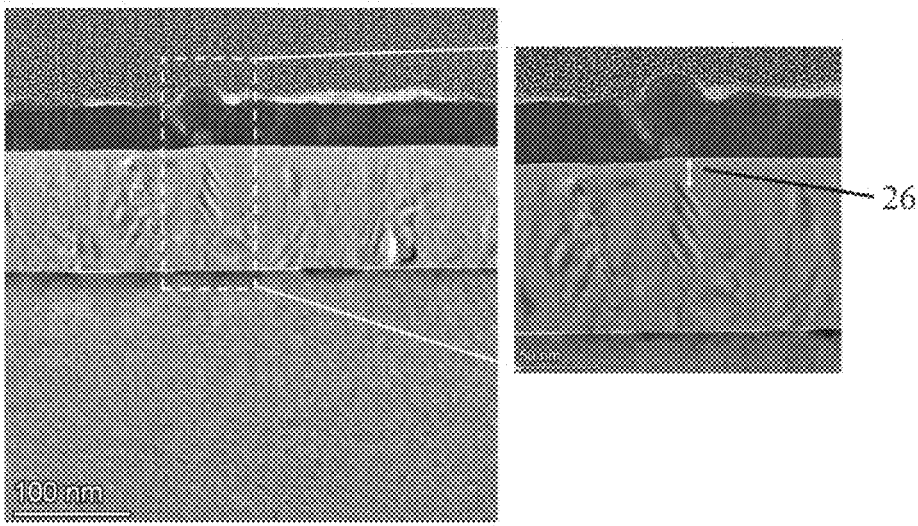
FIG. 14 is a transmission-electron-microscope test picture 1 of a solar cell according to an embodiment of the present application.
Figure 15:
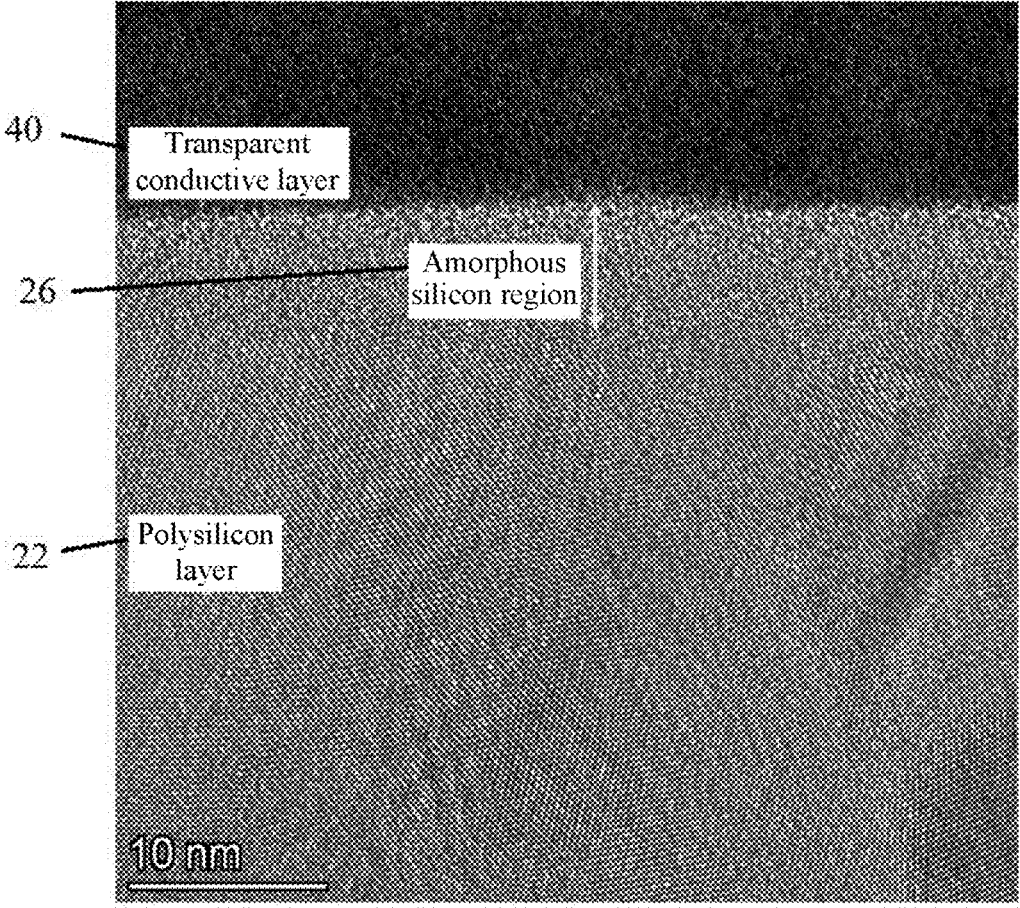
FIG. 15 is a transmission-electron-microscope test picture 2 of a solar cell according to an embodiment of the present application.

FIG. 14 and FIG. 15 are test pictures of a finished product of a solar cell. It can be seen from the test pictures that the amorphous silicon region 26 is arranged on the surface of the polysilicon layer 22.

Step 111: As shown in FIG. 11, remove at least a part of the transparent conductive layer 40 to form a second opening 92.

In this step, the part of the transparent conductive layer 40 between a P region and an N region is removed to form the second opening 92, and the second opening 92 completely insulates the P region from the N region. A method for removing the part of the transparent conductive layer 40 between the P region and the N region includes at least one of a laser ablating method, a photoetching method, and printing caustic slurry.

Step 112: As shown in FIG. 12, through screen printing, prepare a first electrode 61 at a transparent conductive layer 40 corresponding to the N region, and prepare a second electrode 62 at a transparent conductive layer 40 corresponding to the P region.

The first electrode 61 and the second electrode 62 are both metal electrodes. For example, materials of the first electrode 61 and the second electrode 62 both include silver.

In this step, low-temperature silver paste is printed on surfaces of the N region and the P region through screen printing, and then solidification is performed at 200° C., where solidification duration is 30 min, to form the first electrode 61 and the second electrode 62.

Embodiment 2

A difference from Embodiment 1 lies in that energy of laser is different, and remaining parts are correspondingly the same as those in Embodiment 1.

Comparative Example

A difference from Embodiment 1 lies in that there is no amorphous silicon region 26 at the polysilicon layer 22, and remaining parts are correspondingly the same as those in Embodiment 1.

Performance testing is performed, under a same test condition, on 1000 solar cells formed in Embodiment 1 and 1000 solar cells formed in Comparative example. For test results, refer to Table 1.

TABLE 1

| Performance | $J_{sc}$ (mA/cm²) | $V_{oc}$ (mV) | FF (%) | Eff (%) |
|---|---|---|---|---|
| Comparative example | 41.75 | 740 | 84.4 | 26.1 |
| Embodiment 1 | 41.80 | 745.5 | 85 | 26.5 |

In Table 1, each piece of data of Embodiment 1 is a result of performing arithmetic averaging on the test results of the 1000 solar cells corresponding to Embodiment 1, and each piece of data of Comparative example is a result of performing arithmetic averaging on the test results of the 1000 solar cells corresponding to Comparative example. In Table 1, Jsc represents a density of a short-circuit current of the solar cell, and Voc represents an open-circuit voltage of the solar cell. FF represents a fill factor of the solar cell, and Eff represents a photoelectric conversion efficiency of the solar cell. It may be learned from Table 1 that, in comparison with that in Comparative example, a photoelectric conversion efficiency of Embodiment 1 is higher. A main reason lies in that, in Embodiment 1, the amorphous silicon region 26 is formed, through laser processing, on at least a part of the surface that is of the polysilicon layer 22 and that is away from the silicon substrate 10. The amorphous silicon region 26 can reduce a contact resistance between the transparent conductive layer 40 and the polysilicon layer 22 to improve the FF, and avoid a damage caused to the polysilicon layer 22 when the transparent conductive layer 40 is deposited through magnetron sputtering to improve Voc, to help improve a conversion efficiency of the solar cell.

It should be noted that the relational terms herein such as first and second are used only to differentiate an entity or operation from another entity or operation, and do not require or imply any actual relationship or sequence between these entities or operations. In addition, the terms "include," "comprise," and any other variants are intended to cover non-exclusive inclusion, so that a process, a method, an object, or a device that includes a series of elements not only includes such elements, but also includes other elements not expressly listed, or further includes elements inherent to the process, the method, the object, or the device. If no more limitations are made, an element limited by "include a/an . . . " does not exclude other same elements existing in the process, the method, the object, or the device which includes the element.

The embodiments in this specification are all described in a related manner. For same or similar parts in the embodiments, refer to each other. Descriptions of each embodiment focus on differences from other embodiments. Embodiments of an apparatus, an electronic device, a computer-readable storage medium, and a computer program product including instructions are substantially similar to the method embodiment, and therefore are briefly described. For related parts, refer to a part of the descriptions of the method embodiment.

The foregoing descriptions are merely embodiments of the present application and are not intended to limit the protection scope of the present application. Any modification, equivalent replacement, and improvement made within the spirit and principle of the present application are included in the protection scope of the present application.

The invention claimed is:

1. A solar cell, wherein the solar cell comprises:
   a silicon substrate having a first surface and a second surface, wherein the first surface is arranged opposite to the second surface;
   a first transport layer arranged on at least one of the first surface and the second surface, wherein the first transport layer comprises a polysilicon layer, wherein the polysilicon layer of the first transport layer has an amorphous silicon region of the first transport layer, wherein the amorphous silicon region of the first transport layer is arranged on at least a part of a surface that is of the polysilicon layer of the first transport layer and that is away from the silicon substrate; and
   a carrier collection layer arranged on the first transport layer, wherein at least a part of the carrier collection layer is in contact with the amorphous silicon region of the first transport layer.

2. The solar cell according to claim 1, wherein the solar cell further comprises a second transport layer, wherein the first transport layer and the second transport layer are separately arranged on the first surface of the silicon substrate, and the first transport layer and the second transport layer are arranged spaced from each other.

3. The solar cell according to claim 2, wherein the carrier collection layer further comprises a transparent conductive layer, and the transparent conductive layer is at least connected to:

a part of the surface that is of the polysilicon layer and that is away from the silicon substrate;

a part of a surface of the amorphous silicon region and that is away from the silicon substrate; and a part of a surface of the second transport layer and that is away from the silicon substrate.

4. The solar cell according to claim 2, wherein an end portion that is of the first transport layer and that is close to the second transport layer and an end portion that is of the second transport layer and that is close to the first transport layer are laminated to form a laminated portion, wherein the end portion of the first transport layer is arranged between the end portion of the second transport layer and the first surface, and wherein the carrier collection layer further comprises a transparent conductive layer, wherein the transparent conductive layer is at least connected to:

a part of a surface that is of the first transport layer and that is away from the silicon substrate, and a part of a surface that is of the second transport layer and that is away from the silicon substrate, wherein the transparent conductive layer has an opening configured to break electrical connection between the first transport layer and the second transport layer.

5. The solar cell according to claim 2, wherein the first transport layer and the second transport layer are spaced apart by an isolating region, and wherein the carrier collection layer further comprises a transparent conductive layer, wherein the transparent conductive layer is at least connected to:

a part of a surface that is of the first transport layer and that is away from the silicon substrate; and at least connected to a part of a surface that is of the second transport layer and that is away from the silicon substrate, wherein the transparent conductive layer has an opening configured to break electrical connection between the first transport layer and the second transport layer.

6. The solar cell according to claim 2, wherein an end portion that is of the first transport layer and that is close to the second transport layer and an end portion that is of the second transport layer and that is close to the first transport layer are laminated to form a laminated portion, wherein the end portion of the first transport layer is arranged between the end portion of the second transport layer and the first surface, wherein the second transport layer comprises a laminated layer of an intrinsic amorphous silicon region and a doped amorphous silicon region, and wherein the doped amorphous silicon region covering the end portion of the first transport layer has a hole structure.

7. The solar cell according to claim 6, wherein a width of the doped amorphous silicon region having the hole structure ranges from 0.1 μm to 20 μm, wherein the width is measured in an extension direction of the first surface of the silicon substrate.

8. The solar cell according to claim 6, wherein a shape of the hole structure is at least one of a circle, an ellipse, or an irregular pattern from a top view of the solar cell.

9. The solar cell according to claim 1, wherein the solar cell further comprises a second transport layer, wherein the first transport layer is arranged on the first surface of the silicon substrate, and the second transport layer is arranged on the second surface of the silicon substrate.

10. The solar cell according to claim 1, wherein a thickness of the amorphous silicon region ranges from 3% to 30% of a thickness of the polysilicon layer in a thickness direction of the solar cell.

11. The solar cell according to claim 1, wherein a thickness of the amorphous silicon region ranges from 2 nm to 30 nm in a thickness direction of the solar cell.

12. The solar cell according to claim 1, wherein in a unit region in which the carrier collection layer is in direct contact with the first transport layer, an area of the amorphous silicon region ranges from 10% to 90% of an area of the polysilicon layer, wherein areas are measured in a direction perpendicular to a thickness direction of the solar cell.

13. The solar cell according to claim 1, wherein an etching region is arranged on the surface that is of the polysilicon layer of the first transport layer and that is away from the silicon substrate, wherein the amorphous silicon region is arranged on the etching region.

14. The solar cell according to claim 1, wherein the amorphous silicon region comprises a first doping element and/or a second doping element, the polysilicon layer comprises the first doping element, wherein a doping concentration in the amorphous silicon region is greater than a doping concentration in the polysilicon layer.

15. The solar cell according to claim 14, wherein the doping concentration in the amorphous silicon region ranges from $3 \times 10^{19}$ atom quantity/cm$^3$ to $7 \times 10^{19}$ atom quantity/cm$^3$.

16. The solar cell according to claim 1, wherein particles are arranged on the amorphous silicon region.

17. The solar cell according to claim 1, wherein the solar cell further comprises a second transport layer, wherein the second transport layer comprises a polysilicon layer, wherein the polysilicon layer of the second transport layer has an amorphous silicon region of the second transport layer, wherein the amorphous silicon region of the second transport layer is arranged on at least a part of a surface that is of the polysilicon layer of the second transport layer and that is away from the silicon substrate, and wherein a first portion of the carrier collection layer is arranged on the first transport layer and a second portion of the carrier collection layer is arranged on the second transport layer, wherein at least a part of the carrier collection layer is in contact with the amorphous silicon region of the second transport layer.

18. The solar cell according to claim 1, wherein the carrier collection layer is a laminated combination of a transparent conductive layer and a metal electrode layer, wherein the transparent conductive layer is closer to the silicon substrate than the metal electrode layer, wherein a projection of the transparent conductive layer on a surface of the silicon substrate covers an entire amorphous silicon region of the first transport layer, and wherein a projection of the metal electrode layer on the surface of the silicon substrate at least covers a part of the amorphous silicon region of the first transport layer in a thickness direction of the solar cell; or wherein the carrier collection layer is a metal electrode layer, wherein a projection of the metal electrode layer on a surface of the silicon substrate covers the entire amorphous silicon region of the first transport layer in a thickness direction of the solar cell.

19. A manufacturing method for a solar cell, wherein the manufacturing method comprises:

providing a silicon substrate, wherein the silicon substrate has a first surface and a second surface, wherein the first surface is arranged opposite to the second surface;

forming a first transport layer on at least one of the first surface and the second surface, wherein the first transport layer comprises a polysilicon layer;

forming an amorphous silicon region of the first transport layer by performing laser treatment on at least a part of a surface that is of the polysilicon layer of the first transport layer and that is away from the silicon substrate; and forming a carrier collection layer on the first transport layer, wherein at least a part of the carrier collection layer is in contact with the amorphous silicon region of the first transport layer.

20. A photovoltaic module, wherein the photovoltaic module comprises a cover plate, a back sheet, and a solar cell arranged between the cover plate and the back sheet, wherein the solar cell comprises:

a silicon substrate having a first surface and a second surface, wherein the first surface is arranged opposite to the second surface;

a first transport layer arranged on at least one of the first surface and the second surface, wherein the first transport layer comprises a polysilicon layer, wherein the polysilicon layer of the first transport layer has an amorphous silicon region of the first transport layer, wherein the amorphous silicon region of the first transport layer is arranged on at least a part of a surface that is of the polysilicon layer of the first transport layer and that is away from the silicon substrate; and a carrier collection layer arranged on the first transport layer, wherein at least a part of the carrier collection layer is in contact with the amorphous silicon region of the first transport layer.

* * * * *